United States Patent
Azami et al.

(10) Patent No.: US 11,879,041 B2
(45) Date of Patent: Jan. 23, 2024

(54) FILM AND LAMINATE

(71) Applicant: SUMITOMO CHEMICAL COMPANY, LIMITED, Tokyo (JP)

(72) Inventors: Shohei Azami, Tsukuba (JP); Shinji Ohtomo, Tsukuba (JP); Toyonari Ito, Tokyo (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 101 days.

(21) Appl. No.: 17/429,700

(22) PCT Filed: Feb. 13, 2020

(86) PCT No.: PCT/JP2020/005450
§ 371 (c)(1),
(2) Date: Aug. 10, 2021

(87) PCT Pub. No.: WO2020/166644
PCT Pub. Date: Aug. 20, 2020

(65) Prior Publication Data
US 2022/0153937 A1     May 19, 2022

(30) Foreign Application Priority Data

Feb. 15, 2019   (JP) .................................. 2019-025663
Jul. 31, 2019   (JP) .................................. 2019-141071

(51) Int. Cl.
*C08J 5/18*      (2006.01)
*B32B 15/09*     (2006.01)
(Continued)

(52) U.S. Cl.
CPC ................ *C08J 5/18* (2013.01); *B32B 15/09* (2013.01); *B32B 15/20* (2013.01); *B32B 27/36* (2013.01);
(Continued)

(58) Field of Classification Search
None
See application file for complete search history.

(56) References Cited

U.S. PATENT DOCUMENTS 5,529,740 A   6/1996   Jester et al.
6,042,902 A   3/2000   Kuder et al.
(Continued)

FOREIGN PATENT DOCUMENTS

EP   1 830 613 A1   9/2007
JP   08-090570 A    4/1996
(Continued)

OTHER PUBLICATIONS

Hosoda—JP 2011-157533 A—ISR D1+CN D2—MT—LCP polyester film—extrusion—2011 (Year: 2011).*
(Continued)

*Primary Examiner* — John Vincent Lawler
(74) *Attorney, Agent, or Firm* — McDermott Will & Emery LLP

(57) ABSTRACT

Provided is a film including a thermoplastic resin, in which a relative permittivity of the film at a frequency of 1 GHz is 3 or less, a dielectric loss tangent of the film at a frequency of 1 GHz is 0.005 or less, and a molecular orientation (MOR) value of the film, which is measured by a microwave orientation meter, is in a range of 1 to 1.1.

7 Claims, 2 Drawing Sheets

(51) Int. Cl.
  *B32B 15/20* (2006.01)
  *B32B 27/36* (2006.01)
  *C08G 63/60* (2006.01)
  *H05K 1/03* (2006.01)

(52) U.S. Cl.
  CPC ........ *C08G 63/60* (2013.01); *B32B 2307/204* (2013.01); *B32B 2457/08* (2013.01); *C08J 2367/04* (2013.01); *H05K 1/0326* (2013.01)

(56) References Cited

U.S. PATENT DOCUMENTS

| | | |
|---|---|---|
| 2002/0104982 A1 | 8/2002 | St. Lawrence et al. |
| 2003/0178602 A1 | 9/2003 | Okamoto et al. |
| 2004/0192858 A1 | 9/2004 | Katagiri et al. |
| 2005/0113555 A1 | 5/2005 | Okamoto et al. |
| 2008/0048150 A1 | 2/2008 | Hosoda et al. |
| 2011/0240353 A1 | 10/2011 | Kohinata et al. |
| 2012/0161357 A1 | 6/2012 | Miyakoshi et al. |
| 2012/0232188 A1 | 9/2012 | Nakayama |
| 2015/0017413 A1 | 1/2015 | Konno et al. |
| 2019/0357355 A1 | 11/2019 | Ohashi et al. |

FOREIGN PATENT DOCUMENTS

| | | | |
|---|---|---|---|
| JP | 09-131789 A | 5/1997 | |
| JP | 10-034742 A | 2/1998 | |
| JP | 10-338755 A | 12/1998 | |
| JP | 11-147963 A | 6/1999 | |
| JP | 11-221893 A | 8/1999 | |
| JP | 2000-269616 A | 9/2000 | |
| JP | 2002-326312 A | 11/2002 | |
| JP | 2003-268121 A | 9/2003 | |
| JP | 2004-068004 A | 3/2004 | |
| JP | 2004-189867 A | 7/2004 | |
| JP | 2004-196930 A | 7/2004 | |
| JP | 2004-050620 A | 9/2004 | |
| JP | 2004-277731 A | 10/2004 | |
| JP | 2004-285301 A | 10/2004 | |
| JP | 2005-272810 A | 10/2005 | |
| JP | 2006-225641 A | 8/2006 | |
| JP | 2007-154169 A | 6/2007 | |
| JP | 4008249 B2 | 11/2007 | |
| JP | 2008-075063 A | 4/2008 | |
| JP | 2008-100528 A | 5/2008 | |
| JP | 2008-248015 A | 10/2008 | |
| JP | 2008-248016 A | 10/2008 | |
| JP | 2010-031104 A | 2/2010 | |
| JP | 2010-077397 A | 4/2010 | |
| JP | 4479355 B2 | 6/2010 | |
| JP | 2010-149411 A | 7/2010 | |
| JP | 2010-168576 A | 8/2010 | |
| JP | 2011-006629 A | 1/2011 | |
| JP | 2011-062987 A | 3/2011 | |
| JP | 2011-063699 A | 3/2011 | |
| JP | 2011-096471 A | 5/2011 | |
| JP | 2011/157533 * | 8/2011 | ............... C08J 5/18 |
| JP | 2011-157533 A | 8/2011 | |
| JP | 2011-213802 A | 10/2011 | |
| JP | 4816459 B2 | 11/2011 | |
| JP | 2012-082857 A | 4/2012 | |
| JP | 2012-149232 A | 8/2012 | |
| JP | 2012-169535 A | 9/2012 | |
| JP | 2013-032484 A | 2/2013 | |
| JP | 2013/189534 * | 9/2013 | ............. C98G 63/60 |
| JP | 2013-189534 A | 9/2013 | |
| JP | 2013-194225 A | 9/2013 | |
| JP | 2014-046509 A | 3/2014 | |
| JP | 2015-530460 A | 10/2015 | |
| JP | 2017-066360 A | 4/2017 | |
| JP | 2017-101200 A | 6/2017 | |
| JP | 2017-155085 A | 9/2017 | |
| JP | 2018-109090 A | 7/2018 | |
| WO | 2013/146174 A1 | 10/2013 | |
| WO | 2014/052052 A1 | 4/2014 | |
| WO | 2014/188830 A1 | 11/2014 | |
| WO | 2018/163999 A1 | 9/2018 | |

OTHER PUBLICATIONS

Ito—JP 2013-189534 A—ISR D5—MT—LCP polyester film+solvent—2013 (Year: 2013).*

International Search Report issued in corresponding International Patent Application No. PCT/JP2020/005450, dated Apr. 28, 2020, with English translation.

Chinese Office Action issued in corresponding Chinese Patent Application No. 202080012765.0, dated Nov. 17, 2022, with English translation.

Japanese Notice of Reasons for Refusal issued in corresponding Japanese Patent Application No. 2019-141071, dated Sep. 13, 2022, with English translation.

Second Chinese Office Action issued in corresponding Chinese Patent Application No. 202080012765.0, dated May 23, 2023, with English translation.

Taiwanese Office Action issued in corresponding Taiwanese Patent Application No. 109104451, dated Jun. 19, 2023, with English translation.

Satoshi Okamoto, et al., "Newly Developed LCP Film Fabricated by Solvent-Casting Method", Sumitomo Chemical Co., Ltd., Sumitomo Kagaku 2005-I, May 31, 2005, pp. 4-13.

Shinichi Nagata, Kiyohito Koyama, "Measurement of Orientation for Conductive Rubber by Microwave Method", The Japan Society of Polymer Processing, Seikei-Kakou, vol. 11, Issue 2, Feb. 20, 1999, pp. 142-150.

General editorial by Naoyuki Koide, "Development technology for liquid crystal polymers: High performance and functionality", CMC Publishing Co.,Ltd, Dec. 22, 2009 1st printing of the popular edition, pp. 51-55, 123-129, 137-139, 144-146.

General editorial by Masaaki Kakimoto, Akio Takahashi "Development of Substrate Materials for Electronics Package", CMC Publishing Co., Ltd, Dec. 22, 2009 1st printing of the popular edition, pp. 154, 157-161, 163-164, 171.

Tatsuya Sunamoto, Minoru Onodera, "Dielectric Characteristic and Application of the Liquid Crystal Polymer Film Improved the Anisotropy of Complex Dielectric Constant (Complex Permittivity)", The Japan Institute of Electronics Packaging, Journal of The Japan Institute of Electronics Packaging, Nov. 1, 2015, vol. 18, Issue 5, pp. 316-318.

Shimadzu HP, Constant Testing Force Extrusion Type Fine Tube Rheometer Flow Tester Product Information, Printed on Jun. 14, 2023, Shimadzu Corporation. https://www.an.shimadzu.co.jp/products/materials-testing/viscosity-and-flow-testing/cft-ex-series/index.html (Summary) https://www.an.shimadzu.co.jp/products/materials-testing/viscosity-and-flow-tester/cft-ex-series/features.html (Features) https://www.an.shimadzu.co.jp/products/materials-testing/viscosity-and-flow-testing/cft-ex-series/spec.html (Spec) (see p. 4 for the translation).

Dielectric Constant Measurement Overview, printed Jun. 17, 2023, on the website of Toyo Technica, Inc, https://www.toyo.co.jp/material/casestudy/detail/ele22.html.

M. Fukutake et al., "Development of a high heat resistance and high dimension stability LCP film", 1998, The Institute of Circuit and Packaging Engineers, Proceedings of the 12th Annual Conference on Circuit and Packaging, Mar. 9, 1998, pp. 51-52.

Notice of Reasons for Revocation issued in Japanese Patent Application No. 2019-141071, dated Nov. 8, 2023 w/English MT.

* cited by examiner

FILM AND LAMINATE

CROSS REFERENCE TO RELATED APPLICATIONS

This application is the U.S. National Phase under 35 U.S.C. § 371 of International Application No. PCT/JP2020/005450, filed on Feb. 13, 2020, which claims the benefit of Japanese Application No. 2019-025663, filed on Feb. 15, 2019 and Japanese Application No. 2019-141071, filed Jul. 31, 2019, the entire contents of each are hereby incorporated by reference.

TECHNICAL FIELD

The present invention relates to a film and a laminate.

BACKGROUND ART

Insulating materials are used for printed circuit boards on which electronic components are mounted. In recent years, with the development of communication systems and the like, it has been desired to further improve physical properties of the insulating materials, such as dielectric properties.

For example, Patent Document 1 discloses an insulating resin composition containing an epoxy resin containing silyl groups, a curing agent, and an inorganic filler such as silica with the object of reducing dielectric loss.

CITATION LIST

Patent Document

[Patent Document 1]
Japanese Unexamined Patent Application, First Publication No. 2017-66360

SUMMARY OF INVENTION

Technical Problem

However, when an inorganic filler is added to a resin composition as in the method disclosed in Patent Document 1, problems arise in that the adhesive strength to metal foils and the mechanical strength of the insulating base material tend to decrease.

Further, considering the application to next-generation mobile communication systems, it is highly possible that the conventional substrate material has insufficient dielectric properties at high frequencies.

An object of the present invention to provide a film and a laminate thereof, which have suitable quality as a film for electronic components.

Solution to Problem

As a result of intensive studies to achieve the above-described object, the present inventors have made it possible to obtain a film and a laminate thereof, which have a low relative permittivity and a low dielectric loss tangent and have an excellent isotropic property, and thus completed the present invention.

That is, one aspect of the present invention is the following film and laminate.

<1> A film including:
a thermoplastic resin,
in which a relative permittivity of the film at a frequency of 1 GHz is 3 or less,
a dielectric loss tangent of the film at a frequency of 1 GHz is 0.005 or less, and
a molecular orientation (MOR) value of the film, which is measured by a microwave orientation meter, is in a range of 1 to 1.1.

<2> The film according to <1>,
in which the thermoplastic resin is a liquid crystal polyester, and
the liquid crystal polyester has a structural unit including a naphthalene structure.

<3> The film according to <2>,
in which a content of the structural unit including a naphthalene structure is 40 mol % or greater, relative to 100 mol % of a total amount of structural units in the liquid crystal polyester.

<4> The film according to <2> or <3>,
in which the liquid crystal polyester has a structural unit represented by Formula (1), a structural unit represented by Formula (2), and a structural unit represented by Formula (3),

—O—Ar1-CO—    (1)

—CO—Ar2-CO—    (2)

—O—Ar3-O—    (3)

(Ar1 represents a 2,6-naphthalenediyl group, a 1,4-phenylene group, or a 4,4'-biphenylylene group, Ar2 and Ar3 each independently represent a 2,6-naphthalenediyl group, a 2,7-naphthalenediyl group, a 1,4-phenylene group, a 1,3-phenylene group, or a 4,4'-biphenylylene group, and hydrogen atoms in the group represented by Ar1, Ar2, or Ar3 may each be independently substituted with a halogen atom, an alkyl group having 1 to 10 carbon atoms, or an aryl group having 6 to 20 carbon atoms).

<5> The film according to any one of <1> to <4>,
in which a linear expansion coefficient obtained in a temperature range of 50° C. to 100° C. under a condition of a heating rate of 5° C./min is 85 ppm/° C. or less.

<6> A laminate including;
a metal layer; and
a film according to any one of <1> to <5>, which is laminated on the metal layer, <7> The laminate according to <6>,
in which a metal constituting the metal layer is copper.

Advantageous Effects of Invention

According to the present invention, it is possible to provide a film and a laminate thereof, which have suitable quality as a film for electronic components.

DESCRIPTION OF EMBODIMENTS

Hereinafter, embodiments of the film and laminate of the present invention will be described.

«Film»

Figure 1:
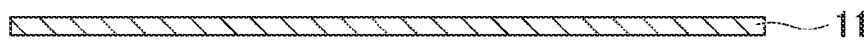
FIG. 1 is a schematic view representing a configuration of a film according to an embodiment of the present invention.

FIG. 1 is a schematic view representing a configuration of a film 11 of the embodiment.

The film of the embodiment is a film including a thermoplastic resin, in which a relative permittivity of the film at a frequency of 1 GHz is 3 or less, a dielectric loss tangent of the film at a frequency of 1 GHz is 0.005 or less, and a molecular orientation (MOR) value of the film, which is measured by a microwave orientation meter, is in a range of 1 to 1.1.

A film satisfying the above-described regulations has suitable quality as a film for electronic components. The quality criteria are the above-described relative permittivity, dielectric loss tangent, and molecular orientation (isotropic property of the film), and the thickness and appearance (presence or absence of holes or through holes) are taken into consideration.

As an example, the values of the relative permittivity and dielectric loss tangent of the film can be controlled by the type of thermoplastic resin. Further, as an example, the degree of an isotropic property of the film can be controlled by the method for producing the film.

In the present specification, the term "dielectric properties" refers to properties relating to a relative permittivity and a dielectric loss tangent.

The film of the embodiment has a relative permittivity at a frequency of 1 GHz of 3 or less, preferably 2.9 or less, more preferably 2.8 or less, still more preferably 2.7 or less, and particularly preferably 2.6 or less. Further, the relative permittivity of the film may be 2.3 or greater, 2.4 or greater, or 2.5 or greater.

The upper limit value and the lower limit value of the above-described relative permittivity value of the above-described film can be freely combined. As examples of the numerical range of the above-described relative permittivity value of the above-described film, it may be 2.3 or greater and 3 or less, 2.4 or greater and 2.9 or less, 2.5 or greater and 2.8 or less, 2.5 or greater and 2.7 or less, or 2.5 or greater and 2.6 or less.

The film of the embodiment has a dielectric loss tangent at a frequency of 1 GHz of 0.005 or less, preferably 0.004 or less, more preferably 0.003 or less, still more preferably 0.002 or less, and particularly preferably 0.001 or less. The dielectric loss tangent of the liquid crystal polyester film may be 0.0003 or greater, 0.0005 or greater, or 0.0007 or greater.

The upper limit value and the lower limit value of the above-described dielectric loss tangent value of the above-described film can be freely combined. As examples of the numerical range of the above-described dielectric loss tangent value of the above-described film, it may be 0.0003 or greater and 0.005 or less, 0.0005 or greater and 0.004 or less, 0.0007 greater and 0.003 or less, 0.0007 or greater and 0.002 or less, or 0.0007 or greater and 0.001 or less.

The relative permittivity and dielectric loss tangent of the film at a frequency of 1 GHz can be measured under the following conditions by a capacity method using an impedance analyzer.

The film is melted at 350° C. using a flow tester, and then cooled and solidified to produce tablets having a diameter of 1 cm and a thickness of 0.5 cm. The relative permittivity and dielectric loss tangent at 1 GHz are measured for the obtained tablets under the following conditions.

Measurement method: capacity method
Electrode model: 16453A
Measurement environment: 23° C., 50% RH
Applied voltage: 1 V In the film of the embodiment, the molecular orientation (MOR) value of the film, which is measured by a microwave orientation meter, is in a range of 1 to 1.1, preferably in a range of 1 to 1.08, more preferably in a range of 1 to 1.06, and still more preferably in a range of 1 to 1.04.

The molecular orientation (MOR) is measured by a microwave molecular orientation meter (for example, MOA-5012A manufactured by Oji Scientific Instruments). The microwave molecular orientation meter is a device which utilizes the fact that, due to the orientation of molecules, the transmission intensity of microwaves differs between an orientation direction and a direction perpendicular to the orientation of the molecules. Specifically, while rotating the sample, the sample is irradiated with microwaves having a constant frequency (12 GHz is used), the intensity of the transmitted microwaves which changes due to the orientation of molecules is measured, and the ratio of the maximum value/minimum value is defined as MOR. The interaction between a microwave electric field with the constant frequency and dipoles constituting the molecules is related to the inner product of the vectors of both. Due to the anisotropy of the dielectric constant of the sample, the intensity of the microwaves changes depending on the angle at which the sample is placed, so that it is possible to know the degree of orientation.

In the film of the embodiment, the linear expansion coefficient obtained in a temperature range of 50° C. to 100° C. under a condition of a heating rate of 5° C./min is preferably 85 ppm/° C. or less, more preferably 50 ppm/° C. or less, still more preferably 40 ppm/° C. or less, and particularly preferably 30 ppm/° C. or less. The lower limit value of the linear expansion coefficient is not particularly limited, but is, for example, 0 ppm/° C. or greater. Further, for example, in a case where a copper foil and the film are laminated, since the linear expansion coefficient of the copper foil is 18 ppm/° C., it is preferable that the linear expansion coefficient of the film of the embodiment be a value close to the linear expansion coefficient of the copper foil. That is, the linear expansion coefficient of the film of the embodiment is preferably 0 ppm/° C. or greater and 50 ppm/° C. or less, more preferably 10 ppm/° C. or greater and 40 ppm/° C. or less, and still more preferably 20 ppm/° C. or greater and 30 ppm/° C. or less. In a case where the linear expansion coefficient differs depending on the direction or portion of the film, the higher value is adopted as the linear expansion coefficient of the film. The linear expansion coefficient of the film can be measured using a thermomechanical analyzer (for example, manufactured by Rigaku Corporation, model: TMA8310). The film of the embodiment, which satisfies the above-described numerical range, has a low linear expansion coefficient and high dimensional stability.

A film having excellent isotropic property has a small difference in linear expansion coefficient depending on the measurement direction.

In the above-described linear expansion coefficient of the film of the embodiment, the difference between a linear expansion coefficient of MD and a linear expansion coefficient of TD (in a case where MD>TD, MD−TD, and in a case where TD>MD, TD−MD) is preferably 2 ppm/° C. or less and more preferably 1 ppm/° C. or less. In a film formed by a casting method, MD is an applying direction of a dispersion liquid. As described in the calculation of the difference in linear expansion coefficient above, it is sufficient to find the linear expansion coefficient in different directions. Therefore, in a case where MD and TD of a film are unknown, any direction of the film is defined as MD and a direction intersecting the direction at 90° is defined as TD, and the directions may be set so that the difference in linear expansion coefficient in each direction is the largest.

The film of the embodiment, which satisfies the above-described numerical range, has an excellent isotropic property of linear expansion and high dimensional stability in the vertical direction and the horizontal direction.

As an appearance, the film of the embodiment preferably has no holes or through holes as a film suitable for electronic components. In the case of having holes or through holes, a plating solution my seep into the holes or through holes during plating. The liquid crystal polyester film produced using, as a raw material, the liquid crystal polyester powder of the embodiment is a high-quality film which has a thickness suitable for electronic components and suppresses the generation of holes or through holes.

The thickness of the film of the embodiment is not particularly limited, but as a thickness suitable for a film for electronic components, it is preferably 5 to 50 µm, more preferably 7 to 40 µm, still more preferably 10 to 33 µm, and particularly preferably 15 to 20 µm.

In the present specification, the "thickness" is an average value obtained by measuring thicknesses of 10 randomly selected places, in accordance with JIS standard (K7130-1992).

As the thermoplastic resin, a raw material resin having excellent dielectric properties is selected from any thermoplastic resin, thereby obtaining a film having excellent dielectric properties.

The content ratio of the thermoplastic resin may be 50% to 100% by mass or 80% to 95% by mass relative to 100% by mass of the total mass of the film of the embodiment.

Examples of the thermoplastic resin include polypropylene, polyamide, polyester, polysulfone, polyphenylene sulfide, polyetherketone, polycarbonate, polyphenylene ether, and polyetherimide.

As the thermoplastic resin, a liquid crystal polyester is preferable in view of its particularly excellent dielectric properties. Hereinafter, a film containing the liquid crystal polyester is referred to as a "liquid crystal polyester film".

The content ratio of the liquid crystal polyester may be 50% to 100% by mass or 80% to 95% by mass relative to 100% by mass of the total mass of the film of the embodiment.

Hereinafter, the details of the liquid crystal polyester which may be included in the film of the embodiment will be described.

(Liquid Crystal Polyester)

The liquid crystal polyester is a liquid crystal polyester which exhibits liquid crystal properties in a molten state, and is preferably melted at a temperature of 450° C. or lower. The liquid crystal polyester may be a liquid crystal polyester amide, a liquid crystal polyester ether, a liquid crystal polyester carbonate, or a liquid crystal polyester imide. The liquid crystal polyester is preferably a wholly aromatic liquid crystal polyester having only a structural unit derived from an aromatic compound as a raw material monomer.

In the present specification, "derived" means that, in order to polymerize the raw material monomer, a chemical structure of a functional group which contributes to the polymerization changes, and no other structural change occurs.

Typical examples of the liquid crystal polyester include:

1) A product obtained by polymerizing (polycondensing) (i) an aromatic hydroxycarboxylic acid, (ii) an aromatic dicarboxylic acid, and (iii) at least one compound selected from the group consisting of an aromatic diol, an aromatic hydroxyamine, and an aromatic diamine, 2) A product obtained by polymerizing multiple types of aromatic hydroxycarboxylic acids, 3) A product obtained by polymerizing (i) an aromatic dicarboxylic acid and (ii) at least one compound selected from the group consisting of an aromatic diol, an aromatic hydroxyamine, and an aromatic diamine, and 4) A product obtained by polymerizing (i) a polyester such as polyethylene terephthalate and (ii) an aromatic hydroxycarboxylic acid.

Here, as the aromatic hydroxycarboxylic acid, the aromatic dicarboxylic acid, the aromatic diol, the aromatic hydroxyamine, and the aromatic diamine, a polymerizable derivative of each may be independently used in place of a part or all thereof.

Examples of a polymerizable derivative of a compound having carboxy group, such as the aromatic hydroxycarboxylic acid and the aromatic dicarboxylic acid, include a compound (ester) obtained by converting the carboxy group into an alkoxycarbonyl group or an aryloxycarbonyl group, a compound (acid halide) obtained by converting the carboxy group into a haloformyl group, and a compound (acid anhydride) obtained by converting the carboxy group into an acyloxycarbonyl group. Examples of a polymerizable derivative of a compound having a hydroxy group, such as the aromatic hydroxycarboxylic acid, the aromatic diol, and the aromatic hydroxyamine, include a compound (acylated product) obtained by acylating the hydroxy group and converting it into an acyloxy group. Examples of a polymerizable derivative of a compound having an amino group, such as the aromatic hydroxyamine and the aromatic diamine, include a compound (acylated product) obtained by acylating the amino group and converting it into an acylamino group.

The liquid crystal polyester preferably has a structural unit including a divalent aromatic hydrocarbon group.

Examples of the liquid crystal polyester having a structural unit including a divalent aromatic hydrocarbon group include a liquid crystal polyester having a structural unit represented by Formula (1), a structural unit represented by Formula (2), and a structural unit represented by Formula (3), and a liquid crystal polyester having a structural unit represented by Formula (2) and a structural unit represented by Formula (3).

  (1)

  (2)

  (3)

($Ar^1$, $Ar^2$, and $Ar^3$ each independently represent a divalent aromatic hydrocarbon group;

hydrogen atoms in the group represented by $Ar^1$, $Ar^2$, or $Ar^3$ may each be independently substituted with a halogen atom, an alkyl group having 1 to 10 carbon atoms, or an aryl group having 6 to 20 carbon atoms.)

Examples of the divalent aromatic hydrocarbon group in $Ar^1$, $Ar^2$, $Ar^3$ include a phenylene group, a naphthylene group, and a biphenylylene group.

Here, examples of the halogen atom in $Ar^1$, $Ar^2$, and $Ar^3$ include a fluorine atom, a chlorine atom, a bromine atom, and an iodine atom. Examples of the above-described alkyl group include a methyl group, an ethyl group, an n-propyl group, an isopropyl group, an n-butyl group, an isobutyl group, an s-butyl group, a t-butyl group, an n-hexyl group, a 2-ethylhexyl group, an n-octyl group, and an n-decyl group, and the number of carbon atoms thereof is usually 1 to 10. Examples of the above-described aryl group include a phenyl group, an o-tolyl group, an m-tolyl group, a p-tolyl group, a 1-naphthyl group, and a 2-naphthyl group, and the number of carbon atoms thereof is usually 6 to 20. In a case where the above-described hydrogen atom is substituted with these groups, the number thereof is usually 2 or less, preferably 1 or less for each of the groups represented by $Ar^1$, $Ar^2$, or $Ar^3$.

The liquid crystal polyester more preferably has a structural unit including a naphthalene structure.

Examples of the liquid crystal polyester having a structural unit including a divalent naphthalene structure include a liquid crystal polyester having a structural unit represented by Formula (1), a structural unit, represented by Formula (2), and a structural unit represented by Formula (3), and a liquid crystal polyester having a structural unit represented by Formula (2) and a structural unit represented by Formula (3).

  (1)

  (2)

  (3)

[$Ar^1$, $Ar^2$, and $Ar^3$ each independently represent a divalent aromatic hydrocarbon group (however, at least one of a plurality of $Ar^1$, $Ar^2$, and $Ar^3$ is a naphthylene group); and hydrogen atoms in the group represented by $Ar^1$, $Ar^2$, or $Ar^3$ may each be independently substituted with a halogen atom, an alkyl group having 1 to 10 carbon atoms, or an aryl group having 6 to 20 carbon atoms.]

$Ar^1$, $Ar^2$, and $Ar^3$ described above may each independently represent a naphthylene group or a phenylene group (however, at least one of a plurality of $Ar^1$, $Ar^2$, and $Ar^3$ is a naphthylene group).

In a case where the liquid crystal polyester has the above-described structural unit represented by Formula (1), the above-described structural unit represented by Formula (2), and the above-described structural unit represented by (3), and at least one of a plurality of $Ar^1$, $Ar^2$, and $Ar^3$ is a naphthylene group, it is preferable that at least one of a plurality of $Ar^1$ and/or $Ar^2$ be a naphthylene group.

In a case where the liquid crystal polyester has the above-described structural unit represented by Formula (2) and the above-described structural unit represented by Formula (3), and at least one of a plurality of $Ar^2$ and $Ar^3$ is a naphthylene group, it is preferable that at least one of a plurality of $Ar^2$ be a naphthylene group.

The above-described naphthylene group in $Ar^1$, $Ar^2$, and $Ar^3$ is preferably a 2,6-naphthalenediyl group or a 2,7-naphthalenediyl group, and more preferably a 2,6-naphthalenediyl group.

The content of the structural unit including a naphthalene structure in the liquid crystal polyester is preferably 40 mol % or greater, more preferably 50 mol % or greater, and still more preferably 60 mol % or greater, relative to 100 mol % of the total amount of all structural units in the liquid crystal polyester (value calculated by dividing the mass of each structural unit constituting the liquid crystal polyester by the formula weight of each structural unit to obtain an amount (mole) of substance equivalent of each structural unit, and summing them up). In a case where the content of the structural unit including a naphthalene structure is the above-described lower limit value or greater, the relative permittivity of the liquid crystal polyester can be further reduced.

The content of the structural unit including a naphthalene structure in the liquid crystal polyester is preferably 90 mol % or less and more preferably 80 mol % or less relative to 100 mol % of the total amount of all structural units in the liquid crystal polyester. In a case where the content of the structural unit including a naphthalene structure is the above-described upper limit value or less, reaction stability in a case of producing the liquid crystal polyester can be ensured.

As an example of the numerical range of the content value of the structural unit including a naphthalene structure, it may be 40 mol % or greater and 90 mol % or less, 50 mol % or greater and 80 mol % or less, or 60 mol % or greater and 80 mol % or less.

The liquid crystal polyester may be a liquid crystal polyester including, among the structural units represented by Formulae (1) to (3) described above, the structural unit represented by Formula (2) and the structural unit represented by Formula (3), or may be a liquid crystal polyester including all kinds of the structural units represented by Formulae (1) to (3).

The liquid crystal polyester may be a liquid crystal polyester consisting of, among the structural units represented by Formulae (1) to (3) described above, the structural unit represented by Formula (2) and the structural unit represented by Formula (3), or may be a liquid crystal polyester consisting of all kinds of the structural units represented by Formulae (1) to (3).

Examples of the liquid crystal polyester having the structural units represented by Formulae (1) to (3) described above include a liquid crystal polyester having a structural unit represented by Formula (1), a structural unit represented by Formula (2), and a structural unit represented by Formula (3).

  (1)

  (2)

  (3)

($Ar^1$, $Ar^2$, and $Ar^3$ each independently represent a naphthalenediyl group, a phenylene group, or a biphenylylene group; and hydrogen atoms in the group represented by $Ar^1$, $Ar^2$, or $Ar^3$ may each be independently substituted with a halogen atom, an alkyl group having 1 to 10 carbon atoms, or an aryl group having 6 to 20 carbon atoms.)

The above-described liquid crystal polyester includes the following liquid crystal polyester:

a liquid crystal polyester having a structural unit represented by Formula (1), a structural unit represented by Formula (2), and a structural unit represented by Formula (3).

  (1)

  (2)

  (3)

($Ar^1$ represents a 2,6-naphthalenediyl group, a 1,4-phenylene group, or a 4,4'-biphenylylene group; $Ar^2$ and $Ar^3$ each independently represent a 2,6-naphthalenediyl group, a 2,7-naphthalenediyl group, a 1,4-phenylene group, a 1,3-phenylene group, or a 4,4'-biphenylylene group; and hydrogen atoms in the group represented by $Ar^1$, $Ar^2$, or $Ar^3$ may each be independently substituted with a halogen atom, an alkyl group having 1 to 10 carbon atoms, or an aryl group having 6 to 20 carbon atoms).

Examples of the liquid crystal polyester having the structural units represented by Formulae (1) to (3) described above include a liquid crystal polyester having a structural unit represented by Formula (1), a structural unit represented by Formula (2), and a structural unit represented by Formula (3).

 (1)

 (2)

 (3)

($Ar^1$ represents a naphthalenediyl group; $Ar^2$ represents a naphthalenediyl group or a phenylene group; $Ar^3$ represents a phenylene group; and hydrogen atoms in the group represented by $Ar^1$, $Ar^2$, or $Ar^3$ may each be independently substituted with a halogen atom, an alkyl group having 1 to 10 carbon atoms, or an aryl group having 6 to 20 carbon atoms.)

In a case where the liquid crystal polyester has all kinds of the structural units represented by Formulae (1) to (3) described above, the proportion of the preferred content of each structural unit in the liquid crystal polyester can be as in the following exemplary examples.

The proportion of the content of the structural unit (1) in the liquid crystal polyester is preferably 30 mol % or greater and 80 mol % or less, more preferably 40 mol % or greater and 70 mol % or less, and still more preferably 45 mol % or greater and 65 mol % or less, relative to 100 mol % of the total amount of all structural units in the liquid crystal polyester.

Further, the proportion of the content of the structural unit (2) in the liquid crystal polyester is preferably 10 mol % or greater and 35 mol % or less, more preferably 15 mol % or greater and 30 mol % or less, and still more preferably 17.5 mol % or greater and 27.5 mol % or less, relative to 100 mol % of the total amount of all structural units in the liquid crystal polyester.

Further, the proportion of the content of the structural unit (3) in the liquid crystal polyester is preferably 10 mol % or greater and 35 mol % or less, more preferably 15 mol % or greater and 30 mol % or less, and still more preferably 17.5 mol % or greater and 27.5 mol % or less, relative to 100 mol % of the total amount of all structural units in the liquid crystal polyester.

Further, it is preferable that the content of the structural unit (2) and the content of the structural unit (3) in the liquid crystal polyester be equal to each other, but in a case where the contents are different, the difference in content between the structural unit (2) and the structural unit (3) is preferably 5 mol % or less.

As an example of a liquid crystal polyester having high heat resistance and melt tension, the proportion of the content of the structural unit (1) in which $Ar^1$ is a 2,6-naphthalenediyl group (for example, a structural unit derived from 2-hydroxy-6-naphthoic acid) is preferably 40 mol % or greater and 74.8 mol % or less, more preferably 40 mol % or greater and 64.5 mol % or less, and still more preferably 50 mol % or greater and 58 mol % or less, relative to the total amount of all structural units in the liquid crystal polyester.

In the liquid crystal polyester, the proportion of the content of the structural unit (2) in which $Ar^2$ is a 2,6-naphthalenediyl group (for example, a structural unit derived from 2,6-naphthalenedicarboxylic acid) is preferably 10.0 mol % or greater and 35 mol % or less, more preferably 12.5 mol % or greater and 30 mol % or less, and still more preferably 15 mol % or greater and 25 mol % or less, relative to the total amount of all structural units in the liquid crystal polyester.

Further, in the liquid crystal polyester, the proportion of the content of the structural unit (2) in which $Ar^2$ is a 1,4-phenylene group (for example, a structural unit derived from terephthalic acid) is preferably 0.2 mol % or greater and 15 mol % or less, more preferably 0.5 mol % or greater and 12 mol % or less, and still more preferably 2 mol % or greater and 10 mol % or less, relative to the total amount of all structural units in the liquid crystal polyester.

In the liquid crystal polyester, the proportion of the content of the structural unit (3) in which $Ar^3$ is a 1,4-phenylene group (for example, a structural unit derived from hydroquinone) is preferably 12.5 mol % or greater and 30 mol % or less, more preferably 17.5 mol % or greater and 30 mol % or less, and still more preferably 20 mol % or greater and 25 mol % or less, relative to the total amount of all structural units in the liquid crystal polyester.

In the liquid crystal polyester, among the structural units (2), the content of a structural unit in which $Ar^2$ is a 2,6-naphthalenediyl group, relative to the total amount of a structural unit in which $Ar^2$ is a 2,6-naphthalenediyl group and a structural unit in which $Ar^2$ is a 1,4-phenylene group, (for example, the content of the structural unit derived from 2,6-naphthalenedicarboxylic acid, relative to the total amount of the structural unit derived from 2,6-naphthalenedicarboxylic acid and the structural unit derived from terephthalic acid) is preferably 0.5 mol times or greater and more preferably 0.6 mol times or greater.

The blending ratio of each structural relative to 100 mol % of the total amount of all structural units in the above-described liquid crystal polyester may even be a blending ratio relative to 100 mol % of the total amount of all structural units derived from aromatic compounds in the liquid crystal polyester.

The sum of the contents of the above-described structural units in the liquid crystal polyester does not exceed 100 mol %.

For example, the liquid crystal polyester of the embodiment can be produced by melt-polycondensing each monomer corresponding to the structural unit.

During this production, in order to enable the melt polycondensation to proceed rapidly, an ester-forming derivative is preferably used as each of the above monomers.

Here, examples of the ester-forming derivative, in the case of compounds having a carboxyl group, such as the aromatic hydroxycarboxylic acid or the aromatic dicarboxylic acid, include compounds in which the carboxyl group has been converted to a haloformyl group, compounds in which the carboxyl group has been converted to an acyloxycarbonyl group, and compounds in which the carboxyl group has been converted to an alkoxycarbonyl group or aryloxycarbonyl group.

Further, in the case of compounds having a hydroxyl group, such as the aromatic hydroxycarboxylic acid and the aromatic diol, examples thereof include compounds in which the hydroxyl group has been converted to an acyloxy group. Among these compounds, compounds in which the hydroxyl group has been converted to an acyloxy group can be used preferably. In other words, an aromatic acyloxycarboxylic acid in which the hydroxyl group of an aromatic hydroxycarboxylic acid has been converted to an acyloxy group can be used preferably as the ester-forming derivative of the aromatic hydroxycarboxylic acid. Further, an aromatic diacyloxy compound in which the hydroxyl groups of an aromatic diol have been converted to acyloxy groups can be used preferably as the ester-forming derivative of the aromatic diol. The acylation is preferably an acetylation using acetic anhydride, and the ester-forming derivative obtained from this acetylation can undergo a deacetylation polycondensation.

The melt polymerization may be performed in the presence of a catalyst, and examples of the catalyst include metal compounds such as magnesium acetate, stannous acetate, tetrabutyl titanate, lead acetate, sodium acetate, potassium acetate, and antimony trioxide, and nitrogen-containing heterocyclic compounds such as 4-(dimethylamino) pyridine and 1-methylimidazole. Among these, a nitrogen-containing heterocyclic compound is preferably used. The melt polymerization may be further performed with a solid phase polymerization as necessary.

In a case where the film of the embodiment includes liquid crystal polyesters, the content of the above-described liquid crystal polyester of the embodiment may be more than 70% by mass and 100% by mass or less, or 80% to 100% by mass relative to the total 100% by mass of liquid crystal polyesters included in the film. Examples of the liquid crystal polyester include those exemplified in the above description of the liquid crystal polyester powder of the embodiment. The liquid crystal polyester is, for example, the liquid crystal polyester of 1) to 4) described above, the liquid crystal polyester having the structural unit represented by Formula (1) described above, the structural unit represented by Formula (2) described above, and the structural unit represented by Formula (3) described above, or the liquid crystal polyester having the structural unit represented by Formula (2) described above and the structural unit represented by Formula (3) described above.

The film of the embodiment may be a film including a thermoplastic resin, in which a relative permittivity of the film at a frequency of 1 GHz is 3 or less, a dielectric loss tangent of the film at a frequency of 1 GHz is 0.005 or less, and a molecular orientation (MOR) value of the film, which is measured by a microwave orientation meter, is in a range of 1 to 1.1 (however, in a case where the liquid crystal polyester is included as the thermoplastic resin, the content of the liquid crystal polyester soluble in an aprotic solvent is less than 5% by mass relative to the total 100% by mass of the liquid crystal polyester).

The film of the embodiment may be a film including a thermoplastic resin, in which a relative permittivity of the film at a frequency of 1 GHz is 3 or less, a dielectric loss tangent of the film at a frequency of 1 GHz is 0.005 or less, and a molecular orientation (MOR) value of the film, which is measured by a microwave orientation meter, is in a range of 1 to 1.1 (however, those including a liquid crystal polyester soluble in an aprotic solvent are excluded).

The liquid crystal polyester soluble in an aprotic solvent may be a liquid crystal polyester including a structural unit derived from 4'-hydroxyacetanilide.

The liquid crystal polyester soluble in an aprotic solvent may be a liquid crystal polyester composed of a structural unit derived from 6-hydroxy-2-naphthoic acid, a structural unit derived from 4'-hydroxyacetanilide, and a structural unit derived from isophthalic acid.

The liquid crystal polyester soluble in an aprotic solvent may be a liquid crystal polyester which is a polymer obtained by reacting a mixture of 6-hydroxy-2-naphthoic acid (5.0 mol), 4'-hydroxyacetanilide (2.5 mol), isophthalic acid (2.5 mol), and acetic anhydride (8.4 mol).

Hereinafter, the liquid crystal polyester soluble in an aprotic solvent will be described.

«Component (X)»

The component (X) is a liquid crystalline polyester which is soluble in an aprotic solvent. Whether the polyester is "soluble in an aprotic solvent" can be confirmed by conducting the following test.

Test Method

The liquid crystalline polyester is stirred for 1 to 6 hours in an aprotic solvent at a temperature of 120° C. to 180° C., and the solution is then cooled to room temperature (23° C.). Subsequently, the solution is filtered using a 5 μm membrane filter and a pressurized filtration device, and the presence of any residue on the membrane filter is ascertained. In a case where no solid matter is noticeable at this time, the liquid crystalline polyester is deemed to be soluble in the aprotic solvent.

More specifically, 1 part by mass of the liquid crystalline polyester is stirred at 140° C. for 4 hours in 99 parts by mass of an aprotic solvent, and the solution is then cooled to 23° C. Subsequently, the solution is filtered using a 5 μm membrane filter and a pressurized filtration device, and the presence of any residue on the membrane filter is ascertained. In a case where no solid matter is noticeable at this time, the liquid crystalline polyester is deemed to be soluble in the aprotic solvent.

The liquid crystalline polyester (X) preferably includes structural units represented by Formulae (X1), (X2), and (X3) shown below as structural units.

In one aspect, relative to the total content of all structural units constituting the component (X), the content of the structural unit represented by Formula (X1) is 30 to 80 mol %, the content of the structural unit represented by Formula (X2) is 35 to 10 mol %, and the content of the structural unit represented by Formula (X3) is 35 to 10 mol %.

However, the total content of the structural unit represented by Formula (X1), the structural unit represented by Formula (X2), and the structural unit represented by Formula (X3) does not exceed 100 mol %.

—O—Ar1-CO—  (X1)

—CO—Ar2-CO—  (X2)

—X—Ar3-Y—  (X3)

(in X1 to X3, Ar1 represents a 1,4-phenylene group, a 2,6-naphthalenediyl group, or a 4,4'-biphenylene group; Ar2 represents a 1,4-phenylene group, a 1,3-phenylene group, or a 2,6-naphthalenediyl group; Ar3 represents a 1,4-phenylene group or a 1,3-phenylene group; and X represents —NH— and Y represents —O— or NH—.)

The structural unit (X1) is a structural unit derived from an aromatic hydroxycarboxylic acid, the structural unit (X2) is a structural unit derived from an aromatic dicarboxylic acid, and the structural unit (X3) is a structural unit derived from an aromatic diamine or an aromatic amine having a phenolic hydroxyl group. The component (X) may use an ester- or amide-forming derivative of any of the structural units instead of the above-described structural units.

In the present embodiment, it is preferable that Ar1 be a 2,6-naphthalenediyl group, Ar2 be a 1,3-phenylene group, Ar3 be a 1,4-phenylene group, and Y be —O—.

Examples of ester-forming derivatives of carboxylic acids include derivatives in which the carboxy group has been replaced with an acid chloride or a highly reactive group such as an acid anhydride group that promotes the reaction that produces a polyester, and derivatives which form an ester with an alcohol or ethylene glycol or the like, such that the carboxy group produces a polyester through a transesterification.

Examples of ester-forming derivatives of a phenolic hydroxyl group include derivatives in which the phenolic hydroxyl group forms an ester with a carboxylic acid.

Examples of amide-forming derivatives of an amino group include derivatives in which the amino group forms an amide with a carboxylic acid.

Examples of the repeating structural units of the component (X) used in the present embodiment include, but are not limited to, those described below.

Examples of the structural unit represented by Formula (X1) include structural units derived from p-hydroxybenzoic acid, 6-hydroxy-2-naphthoic acid, or 4'-hydroxy-4-biphenylcarboxylic acid, and two or more types of these structural units may be included in all structural units. Among these structural units, it is preferable to use a component (X) which includes a structural unit derived from 6-hydroxy-2-naphthoic acid.

The content of the structural unit (X1), relative to the content of all structural units constituting the component (X), is 30 mol % or greater and 80 mol % or less, preferably 40 mol % or greater and 70 mol % or less, and more preferably 45 mol % or greater and 65 mol % or less.

In a case where the amount of the structural unit (X1) is large, solubility in a solvent tends to deteriorate markedly, whereas in a case where the amount thereof is too small, the polyester tends to not exhibit liquid crystal properties. In other words, in a case where the content of the structural unit (X1) is within the above-described range, the solubility in a solvent is favorable, and the polyester exhibits liquid crystal properties more readily.

Examples of the structural unit represented by formula (X2) include structural units derived from terephthalic acid, isophthalic acid, or 2,6-naphthalenedicarboxylic acid, and two or more types of these structural units may be included in all structural units. Among these structural units, from the viewpoint of the solubility in a solvent, it is preferable to use a liquid crystalline polyester including a structural unit derived from isophthalic acid.

The content of the structural unit (X2), relative to the content of all structural units constituting the component (X), is preferably 10 mol % or greater and 35 mol % or less, more preferably 15 mol % or greater and 30 mol % or less, and particularly preferably 17.5 mol % or greater and 27.5 mol % or less. In a case where the amount of the structural unit (X2) is too large, the liquid crystal properties tend to deteriorate, whereas in a case where the amount thereof is small, the solubility in a solvent tends to deteriorate. In other words, in a case where the content of the structural unit (X2) is within the above-described range, the liquid crystal properties are favorable, and the solubility in a solvent is also favorable.

Examples of the structural unit represented by Formula (X3) include structural units derived from 3-aminophenol, 4-aminophenol, 1,4-phenylenediamine, or 1,3-phenylenediamine, and two or more types of these structural units may be included in all structural units.

Among these structural units, from the viewpoint of reactivity, it is preferable to use a liquid crystalline polyester including a structural unit derived from 4-aminophenol.

The content of the structural unit (X3), relative to the content of all structural units constituting the component (X), is preferably 10 mol % or greater and 35 mol % or less, more preferably 15 mol % or greater and 30 mol % or less, and particularly preferably 17.5 mol % or greater and 27.5 mol % or less. In a case where the amount of the structural unit (3) is too large, the liquid crystal properties tend to deteriorate, whereas in a case where the amount thereof is small, the solubility in a solvent tends to deteriorate. In other words, in a case where the content of the structural unit (X3) is within the above-described range, the liquid crystal properties are favorable, and the solubility in a solvent is also favorable.

The structural unit (X3) is preferably used in an amount that is substantially equal to that of the structural unit (X2), but by varying the content of the structural unit (X3) within a range from −10 mol % to +10 mol % relative to the content of the structural unit (X2), the degree of polymerization of the liquid crystalline polyester can be controlled.

There are no particular limitations on the method for producing the component (X) according to the present embodiment, but examples thereof include methods in which an acylated product obtained by conducting an acylation of the phenolic hydroxyl group and amino group of an aromatic hydroxy acid corresponding to the structural unit (X1) and an aromatic amine having a phenolic hydroxyl group or an aromatic diamine corresponding to the structural unit (X3) in an excess of a fatty acid anhydride, and an aromatic dicarboxylic acid corresponding to the structural unit (X2) are subjected to a melt polymerization by a transesterification-transamidation (polycondensation) (for example, see Japanese Unexamined Patent Application, First Publication No. 2002-220444 and Japanese Unexamined Patent Application, First Publication No. 2002-146003).

In the acylation reaction, the amount of the fatty acid anhydride added, relative to the total amount of the phenolic hydroxyl group and the amino group, is preferably 1.0 to 1.2 equivalents, and more preferably 1.05 to 1.1 equivalents. In a case where the amount of the fatty acid anhydride added is too small, the acylated product, the raw material monomer, and the like tend to undergo sublimation during the transesterification-transamidation (polycondensation), increasing the likelihood of blockages of the reaction system, whereas in a case where the amount thereof is too large, coloration of the obtained liquid crystalline polyester tends to become marked. In other words, in a case where the amount of the fatty acid anhydride added is within the above-described range, the reaction between the acylated product, the raw material monomer, and the like during transesterification-transamidation (polycondensation) proceeds favorably, and the obtained liquid crystalline polyester does not undergo excessive coloration.

The acylation reaction is preferably conducted at 130° C. to 180° C. for 5 minutes to 10 hours, and more preferably conducted at 140° C. to 160° C. for 10 minutes to 3 hours.

There are no particular limitations on the fatty acid anhydride used in the acylation reaction, and examples thereof include acetic anhydride, propionic anhydride, butyric anhydride, isobutyric anhydride, valeric anhydride, pivalic anhydride, 2-ethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, maleic anhydride, succinic anhydride, and β-bromopropionic anhydride, and a mixture of two or more of these fatty acid anhydrides may be used. In the present embodiment, acetic anhydride, propionic anhydride, butyric anhydride, or isobutyric anhydride is preferable, and acetic anhydride is more preferable.

In the transesterification-transamidation (polycondensation), the amount of acyl groups in the acylated product is preferably 0.8 to 1.2 equivalents relative to the amount of carboxyl groups.

The transesterification-transamidation (polycondensation) is preferably performed while increasing the temperature to 400° C. at a rate of 0.1 to 50° C./min, and is more preferably performed while increasing the temperature to 350° C. at a rate of 0.3 to 5° C./min.

In the case of conducting the transesterication-transamidation (polycondensation) of the acylated product and the carboxylic acid, the by-product fatty acid and unreacted fatty acid anhydride are preferably removed from the system by evaporation or the like.

The acylation reaction and the transesterification-transamidation (polycondensation) may be conducted in the presence of a catalyst. As the catalyst, conventional catalysts which are known as a catalyst for polyester polymerization can be used, and examples thereof include metal salt catalysts such as magnesium acetate, stannous acetate, tetrabutyl titanate, lead acetate, sodium acetate, potassium acetate, and antimony trioxide, and organic compound catalysts such as N,N-dimethylaminopyridine and N-methylimidazole.

Among these catalysts, a heterocyclic compound including at least two nitrogen atoms, such as N,N-dimethylaminopyridine and N-methylimidazole, can be preferably used (see Japanese Unexamined Patent Application, First Publication No. 2002-146003).

The catalyst is usually added in the case of adding the monomers, it is not always necessary to remove the catalyst even after the acylation, and in a case where the catalyst is not removed, the transesterification can be performed immediately.

Polycondensation through the transesterification-transamidation is usually performed by melt polymerization, but a combination of melt polymerization and solid phase polymerization may also be used. The solid phase polymerization is preferably performed by extracting the polymer from the melt polymerization step, subsequently grinding the polymer to produce a powder or flake form, and then using a conventional solid phase polymerization method. Specifically, the solid phase polymerization can be conducted, for example, by performing a heat treatment in a solid phase state for 1 to 30 hours, at a temperature of 20° C. to 350° C. and under an inert atmosphere of nitrogen or the like. The solid phase polymerization may be performed under stirring, or may be performed in a still state without stirring. By fitting an appropriate stirring mechanism, the same reaction tank can be employed as the melt polymerization tank and the solid phase polymerization tank. After the solid phase polymerization, the obtained liquid crystalline polyester may be pelletized and molded using a conventional method. Further, the liquid crystalline polyester may also be ground using a conventional method.

The production of the liquid crystalline polyester may be conducted, for example, using a batch apparatus, a continuous apparatus, or the like.

In a case where the liquid crystalline polyester (X) is converted to a powdered form, the volume average particle diameter is preferably within a range from 100 to 2000 μm.

The volume average particle diameter of the powdered liquid crystalline polyester (X) can be measured using a dry sieving method (for example, RPS-105 manufactured by Seishin Enterprise Co., Ltd.).

In one aspect, the content of the component (X), relative to the total mass of the liquid crystalline polyester liquid composition, is preferably 5% to 10% by mass.

[Production Example of Liquid Crystalline Polyester (X)]

A reactor equipped with a stirrer, a torque meter, a nitrogen gas inlet tube, a thermometer, and a reflux condenser is charged with 940.9 g (5.0 mol) of 6-hydroxy-2-naphthoic acid, 377.9 g (2.5 mol) of 4'-hydroxyacetanilide, 415.3 g (2.5 mol) of isophthalic acid, and 867.8 g (8.4 mol) of acetic anhydride. After flushing the gas inside the reactor with nitrogen gas, the temperature is increased from room temperature (23° C.) to 140° C. over 60 minutes under a stream of nitrogen gas with constant stirring, and the mixture is refluxed at 140° C. for 3 hours. Subsequently, while distilling off by-product acetic acid and unreacted acetic anhydride, the temperature is increased from 150° C. to 300° C. over 5 hours, and the mixture is held at 300° C. for 30 minutes, and then taken out from the reactor and cooled to room temperature (23° C.). The obtained solid matter is ground with a grinder to obtain a powdered liquid crystalline polyester (X-1). The flow start temperature of this liquid crystalline polyester (X-1) is 193.3° C.

The liquid crystalline polyester (X-1) is subjected to a solid phase polymerization under a nitrogen atmosphere by increasing the temperature from room temperature (23° C.) to 160° C. over 2 hours and 20 minutes, subsequently raising the temperature from 160° C. to 180° C. over 3 hours and 20 minutes, and then holding the temperature at 180° C. for 5 hours, and the product is cooled to room temperature (23° C.) and ground in a grinder to obtain a powdered liquid crystalline polyester (X-2). The flow start temperature of this liquid crystalline polyester (X-2) is 220° C.

The liquid crystalline polyester (X-2) is subjected to a solid phase polymerization under a nitrogen atmosphere by increasing the temperature from room temperature to 180° C. over 1 hour and 25 minutes, subsequently increasing the temperature from 180° C. to 255° C. over 6 hours and 40 minutes, and then holding the temperature at 255° C. for 5 hours, and the product is cooled to 23° C. to obtain a powdered liquid crystalline polyester (X) having a volume average particle diameter of 871 μm. The volume average particle diameter of the liquid crystalline polyester (X) is measured using an RPS-105 manufactured by Seishin Enterprise Co. Ltd. The flow start temperature of the liquid crystalline polyester (X) is 302° C.

[Preparation of Liquid Crystalline Polyester Solution (X')]

8 parts by mass of the liquid crystalline polyester (X) is added to 92 parts by mass of N-methylpyrrolidone (boiling point (1 atm): 204° C.), and the mixture is stirred at 140° C. for 4 hours under a nitrogen atmosphere to prepare a liquid crystalline polyester solution (X'). The viscosity of this liquid crystalline polyester solution (X') is 955 mPa·s.

The method for producing the film of the embodiment is not particularly limited, but the film of the embodiment can be produced according to «Method for producing film» that will be described later. In «Method for producing film» that will be described later, one embodiment using the liquid crystal polyester as a raw material will be described in detail. However, in the method, by reading the liquid crystal polyester as any thermoplastic resin, the film of the embodiment including any thermoplastic resin may be produced.

According to the method for producing the film of the embodiment, a film having an excellent isotropic property can be produced.

According to the method for producing the film of the embodiment, a film having dielectric properties and an isotropic property that are excellent can be produced.

The film of the embodiment can be suitably used for a film application for electronic components such as a printed wiring board. The film of the embodiment can be provided as a substrate (for example, a flexible substrate), a laminated board (for example, a flexible copper-clad laminated board), a printed board, a printed wiring board, a printed circuit, and the like, which are provided with the film of the embodiment as an insulating material.

«Method for Producing Film»

The method for producing the film of the embodiment includes applying a resin composition on a support and heat-treating the resin composition to obtain a film including a thermoplastic resin.

The resin composition of the embodiment contains a resin powder and medium. Details of the resin composition, the resin powder, and the medium will be described later.

The thermoplastic resin is preferably a liquid crystal polyester.

Hereinafter, embodiments in which the liquid crystal polyester is used as the thermoplastic resin will be described.

The method for producing the film of the embodiment (hereinafter, also referred to as a "method for producing a liquid crystal polyester film") includes applying a liquid crystal polyester composition on a support and heat-treating the liquid crystal polyester composition to obtain liquid crystal polyester film including the liquid crystal polyester.

The producing method may include the following steps.

A step of applying the liquid crystal polyester composition according to the embodiment to a support to form a precursor of a liquid crystal polyester film on the support (coating step)

A step of heat-treating the above-described precursor of the liquid crystal polyester film to obtain a liquid crystal polyester film (heat-treating step)

The coating step of the method for producing a liquid crystal polyester film may include a step of, after applying the liquid crystal polyester composition according to the embodiment to a support, removing the medium from the applied liquid crystal polyester composition (drying step).

In other words, the method for producing the liquid crystal polyester film according to the embodiment may include applying the liquid crystal polyester composition according to the embodiment to a support, removing a medium from the applied liquid crystal polyester composition, and heat-treating the liquid crystal polyester composition to obtain a liquid crystal polyester film including the liquid crystal polyester.

Further, the method for producing the liquid crystal polyester film may further include a step of separating the support from the above-described laminate (separating step). Since the liquid crystal polyester film can be suitably used as a film for electronic components even when formed on the support as a laminate, the separating step is not an essential step in the producing process of the liquid crystal polyester film.

Hereinafter, an example of the method for producing the liquid crystal polyester film of the embodiment will be described with reference to a drawing.

Figure 3:
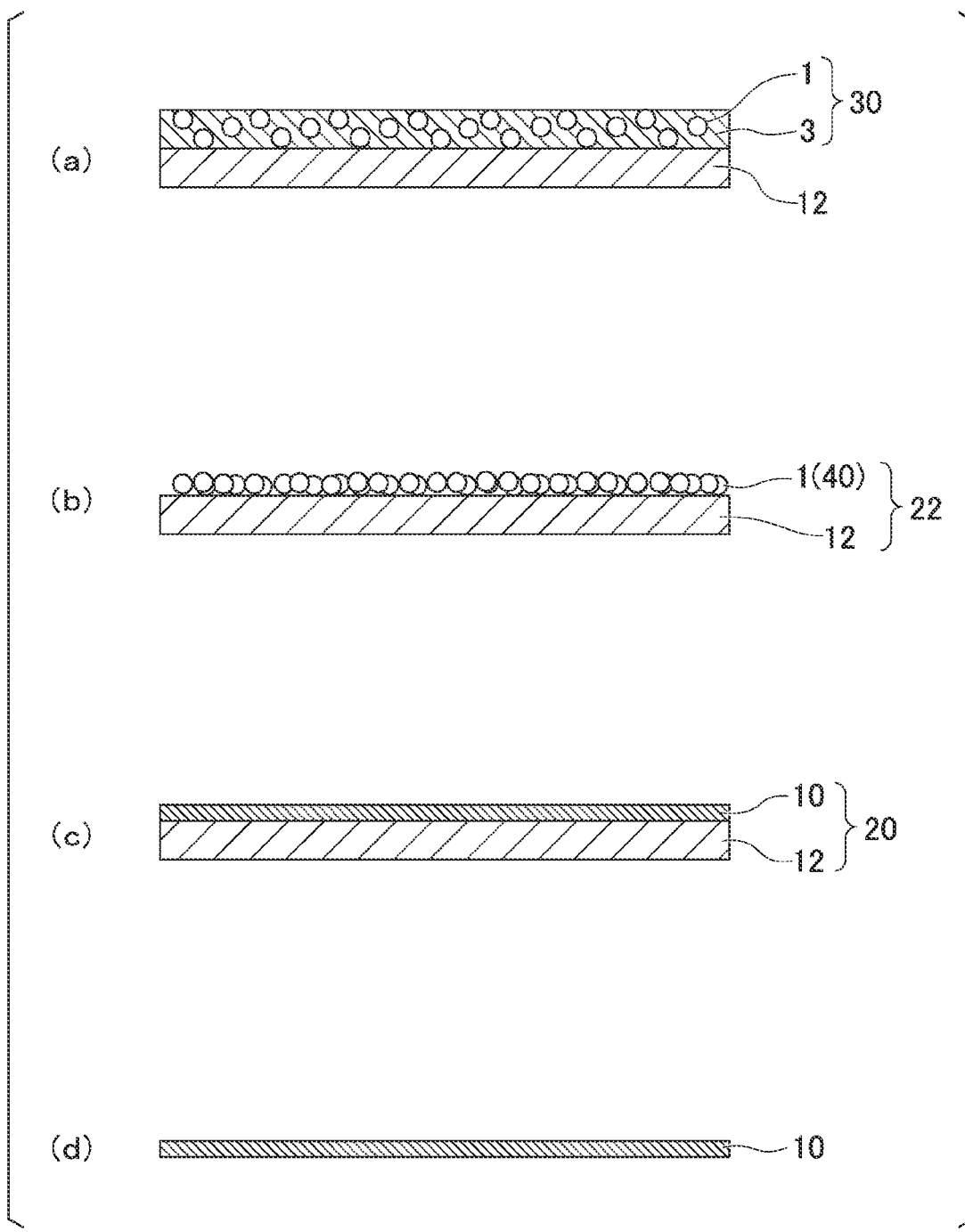
FIG. 3 is a schematic view representing a producing process of a liquid crystal polyester film and a laminate according to the embodiment of the present invention.

FIG. 3 is a schematic view representing an example of the producing process of the liquid crystal polyester film and laminate of the embodiment.

First, a liquid crystal polyester composition 30 is applied to a support 12 ((a) of FIG. 3: coating step). The liquid crystal polyester composition 30 contains a liquid crystal polyester powder 1 and a medium 3. The liquid crystal polyester liquid composition can be applied to the support by a roller coating method, a dip coating method, a spray coating method, a spinner coating method, a curtain coating method, a slot coating method, a screen printing method, or the like, and a method capable of applying liquid crystal polyester liquid composition to the support on a surface smoothly and uniformly can be appropriately selected. Further, in order to make the distribution of the liquid crystal polyester powder uniform, an operation of stirring the liquid crystal polyester composition may be performed before coating.

The support 12 is preferably in the shape of a plate, a sheet, or a film, and examples thereof include a glass plate, a resin film, and a metal foil. Among these, a resin film or a metal foil is preferable, and a copper foil is particularly preferable because a copper foil has excellent heat resistance, a liquid composition is easy to apply to it, and it is easy to remove from the liquid crystal polyester film.

Examples of a commercially available product of a polyimide (PI) film include "U-pilexS" and "U-pilexR" from UBE INDUSTRIES, LTD., "Kapton" from DU PONT-TORAY CO., LTD., and "IF30", "IF70", and "LV300" from SKC Kolon PI. The thickness of the resin films is preferably 25 μm or greater and 75 μm or less and more preferably 50 μm or greater and 75 μm or less. The thickness of the metal foil is preferably 3 μm or greater and 75 μm or less, more preferably 5 μm or greater and 30 μm or less, and still more preferably 10 μm or greater and 25 μm or less.

Next, the medium 3 is removed from the liquid crystal polyester composition 30 applied on the support 12 ((b) of FIG. 3: drying step). The liquid crystal polyester composition from which the medium 3 has been removed becomes a liquid crystal polyester film precursor 40 to be heat-treated. It is not necessary that the medium 3 be completely removed from the liquid crystal polyester composition, and a part of the medium contained in the liquid crystal polyester composition may be removed, or the entire medium may be removed. The proportion of the solvent contained in the liquid crystal polyester film precursor 40 is preferably 50% by mass or less, more preferably 3% by mass or greater and 12% by mass or less, and still more preferably 5% by mass or greater and 10% by mass or less, relative to the total mass of the liquid crystal polyester film precursor. In a case where the content of the solvent in the liquid crystal polyester film precursor is the above-described lower limit value or greater, the possibility of thermal conductivity of the liquid crystal polyester film being lowered is reduced. Further, in a case where the content of the solvent in the liquid crystal polyester film precursor is the above-described upper limit value or less, the possibility of the appearance of the liquid crystal polyester film being deteriorated due to foaming during heat treatment is reduced.

The removal of the medium is preferably performed by evaporating the medium, examples thereof include heating, depressurization, and ventilation, and these may be combined. Further, the medium may be removed in a continuous manner or in a single-wafered manner. From the viewpoint of productivity and operability, the medium is preferably removed by heating in a continuous manner, and more preferably by heating while ventilating in a continuous manner. The removal temperature of the medium is preferably a temperature lower than the melting point of the liquid crystal polyester powder, and for example, the removal temperature thereof is 40° C. or higher and 200° C. or lower, preferably 60° C. or higher and 200° C. or lower. The removal time of the medium is appropriately adjusted so that the content of the medium in the liquid crystal polyester film precursor is, for example, 3% to 12% by mass. The time for removing the medium is, for example, 0.2 hours or greater and 12 hours or less, preferably 0.5 hours or greater and 8 hours or less.

A laminate precursor 22 having the support 12 and the liquid crystal polyester film precursor 40, obtained as described above, is heat-treated to obtain a laminate 20 having the support 12 and a liquid crystal polyester film 10 (a film obtained by heat-treating the liquid crystal polyester film precursor 40) ((c) of FIG. 3: heat-treating step). In this case, the liquid crystal polyester film 10 formed on the support is obtained.

Examples of conditions of the heat treatment include a condition in which, after increasing the temperature from (the boiling point of the medium—50° C.) until it reaches the heat treatment temperature, the heat treatment is performed at a temperature equal to or higher than the melting point of the liquid crystal polyester.

In the case of increasing the temperature, the polymerization reaction of the liquid crystal polyester may proceed due to heating, but by increasing the heating rate until the heat treatment temperature is reached, an increase in the molecular weight of the liquid crystal polyester in the liquid crystal polyester powder can be suppressed to some extent, the melting of the liquid crystal polyester powder becomes good, and a high-quality film can be easily obtained. The heating rate from (the boiling point of the solvent—50° C.) until the heat treatment temperature is reached is preferably 3° C./min or higher and more preferably 5° C./min or higher.

The heat treatment temperature is preferably the melting point of the liquid crystal polyester or higher, more preferably a temperature higher than the melting point of the liquid crystal polyester, and still more preferably a temperature of the melting point of the liquid crystal polyester+5° C. or higher. The heat treatment temperature may be appropriately determined depending on the type of the liquid crystal polyester, and as an example, the heat treatment temperature is preferably 230° C. or higher and 400° C. or lower, more preferably 300° C. or higher and 380° C. or lower, and still more preferably 320° C. or higher and 350° C. or lower. By performing the heat treatment at a temperature higher than the melting point of the liquid crystal polyester, the liquid crystal polyester powder melts well, and a high-quality liquid crystal polyester film can be formed. The fact that the liquid crystal polyester powder could be melted can be ascertained by the fact that the liquid crystal polyester film precursor 40 became transparent.

The boiling point of the medium in the description is a boiling point at the pressure in a case of increasing the temperature. Further, in a case where heating the laminate precursor 22 is started from lower than (the boiling point of the medium—50° C.), the heating rate may be set in a range from reaching (the boiling point of the medium—50° C.) to reaching the heat treatment temperature. The time until reaching (the boiling point of the medium—50° C.) is arbitrary. Further, the time after reaching the heat treatment temperature may be considered as a heat treatment time. The heat treatment time may be, for example, 0.5 hours or greater, 1 hour or greater and 24 hours or less, or 3 hours or greater and 12 hours or less.

Like the removal of the medium, the heat treatment may be performed in a continuous manner or in a single-wafered manner, but from the viewpoint of productivity and operability, it is preferable to perform it in a continuous manner, and it is more preferable to perform it in a continuous manner following the removal of the medium.

Subsequently, the liquid crystal polyester film 10 is separated from the laminate 20 having the support 12 and the liquid crystal polyester film 10, thereby obtaining the liquid crystal polyester film 10 as a single-layer film ((d) of FIG. 3: separating step). In a case where a glass plate is used as the support 12, the liquid crystal polyester film 10 may be separated front the laminate 20 by peeling off the liquid crystal polyester film 10 from the laminate 20. In a case where a resin film is used as the support 12, the liquid crystal polyester film 10 may be separated from the laminate 20 by peeling off the resin film or the liquid crystal polyester film 10 from the laminate 20. In a case where a metal foil is used as the support 12, the liquid crystal polyester film 10 may be separated from the laminate 20 by etching the metal foil to remove the metal foil from the laminate 20. In a case where a resin film, particularly a polyimide film, is used as the support, the polyimide film or the liquid crystal polyester film is easily peeled off from the laminate 20, and a liquid crystal polyester film having a good appearance can be obtained. In a case where a metal foil is used as the support, the laminate 20 may be used as a metal-clad laminate for a printed wiring board without separating the liquid crystal polyester film from the laminate 20.

According to the method for producing the liquid crystal polyester film of the embodiment, a liquid crystal polyester film having an excellent isotropic property can be produced.

In the conventional melt molding method, a thin film of liquid crystal polyester has been produced by forming a film of melted liquid crystal polyester. On the other hand, the above-described producing method of the embodiment is significantly different from the conventional film producing method in that a liquid crystal polyester powder is thinly placed on the support in advance and then melted.

In the method for producing a liquid crystal polyester film or laminate of the embodiment, since a liquid crystal polyester powder is thinly placed on the support in advance and then made into a film, it is possible to produce a liquid crystal polyester film having an excellent isotropic property without applying a physical force which causes a bias in molecular orientation, such as extrusion molding.

Further, since the number average molecular weight of the liquid crystal polyester in the liquid crystal polyester powder is a relatively small value of 10000 or less, the liquid crystal polyester composition has properties suitable for coating, and the melting state of the liquid crystal polyester film during heat treatment becomes good, so that it is possible to produce a high-quality liquid crystal polyester film having an excellent isotropic property, which is suitable for a film application for electronic components.

Furthermore, by using, as a raw material, a liquid crystal polyester powder having an average particle diameter of 0.5 to 20 μm, it is possible to produce a high-quality polyester film which has a thinness suitable for a film application for electronic components and in which the generation of holes or through holes is suppressed.

Moreover, since the liquid crystal polyester composition has no limitation that the liquid crystal polyester powder should be soluble in the medium, a liquid crystal polyester having excellent dielectric properties can be adopted, and a liquid crystal polyester film having dielectric properties and an isotropic property that are excellent can be easily obtained.

«Laminate»

The laminate of the embodiment includes a metal layer and the film according to the embodiment, which is laminated on the metal layer.

Figure 2:
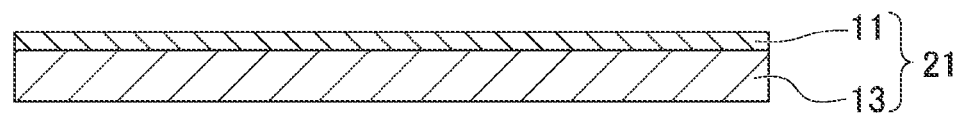
FIG. 2 is a schematic view representing a configuration of a laminate according to an embodiment of the present invention.

FIG. 2 is a schematic view representing a configuration of a laminate 21 according to the embodiment of the present invention. The laminate 21 includes a metal layer 13 and a film 11 laminated on the metal layer 13.

Examples of the film included in the laminate include those exemplified above, and the description thereof will be omitted.

Examples of the metal layer included in the laminate include those exemplified as a support in «Method for producing film» described above and «Method for producing laminate» that will be described later, and a metal foil is preferable. From the viewpoint of conductivity and cost, copper is preferable as a metal constituting the metal layer, and a copper foil is preferable as the metal foil.

The thickness of the laminate of the embodiment is not particularly limited, but it is preferably 5 to 130 μm, more preferably 10 to 70 μm, and still more preferably 15 to 60 μm.

The method for producing the laminate of the embodiment is not particularly limited, but the laminate of the embodiment can be produced according to «Method for producing laminate» that will be described later. In «Method for producing laminate» that will be described later, one embodiment using the liquid crystal polyester as a raw material will be described in detail. However, in the method, by reading the liquid crystal polyester as any thermoplastic resin, the laminate of the embodiment including a film including any thermoplastic resin may be produced.

The laminate of the embodiment can be suitably used for a film application for electronic components such as a printed wiring board.

«Method for Producing Laminate»

The method for producing the laminate of the embodiment includes applying a resin composition on a support and heat-treating the resin composition to form a film including a thermoplastic resin, thereby obtaining a laminate including the support and the film.

The thermoplastic resin is preferably a liquid crystal polyester.

Hereinafter, embodiments in which the liquid crystal polyester is used as the thermoplastic resin will be described.

The method for producing the laminate of the embodiment includes applying a liquid crystal polyester composition on a support and heat-treating the liquid crystal polyester composition to form a liquid crystal polyester film including a liquid crystal polyester, thereby obtaining a laminate including the support and the liquid crystal polyester film.

The producing method may include the following steps.

A step of applying a liquid crystal polyester composition to a support to form a liquid crystal polyester film precursor on the support (coating step)

A step of heat-treating the above-described liquid crystal polyester film precursor to obtain a laminate including the support and the liquid crystal polyester film (heat-treating step)

Like the above-described method for producing a liquid crystal polyester film, the coating step of the method for producing a laminate may include a step of, after applying the liquid crystal polyester composition according to the embodiment to a support, removing the medium from the applied liquid crystal polyester composition (drying step).

In other words, the method for producing the laminate according to the embodiment may include applying the liquid crystal polyester composition according to the embodiment to a support, removing a medium from the applied liquid crystal polyester composition, and heat-treating the liquid crystal polyester composition to form a liquid crystal polyester film including the liquid crystal polyester, thereby obtaining a laminate including the support and the liquid crystal polyester film.

FIG. 3 is a schematic view representing an example of the producing process of the liquid crystal polyester film and laminate of the embodiment. The method for producing a laminate illustrated in FIG. 3 is the same as that described in the above-described method for producing a liquid crystal polyester film, except that the above-described separating step ((d) of FIG. 3) is not performed, and thus the description thereof will be omitted.

According to the method for producing the laminate of the embodiment, a laminate having the liquid crystal polyester film of the embodiment can be produced.

«Resin Composition»

The resin composition of the embodiment contains a medium and a resin powder. The resin composition is suitably used for producing the above-described film.

The resin powder is preferably a liquid crystal polyester powder. Details of the resin powder will be described later.

The resin composition of the embodiment preferably contains an aprotic solvent and a liquid crystal polyester powder insoluble in the aprotic solvent.

Hereinafter, embodiments in which the liquid crystal polyester is used as the thermoplastic resin be described.

The composition of the embodiment contains a medium and a liquid crystal polyester powder (hereinafter referred to as a "liquid crystal polyester composition").

The liquid crystal polyester powder will be described later in <Resin powder>.

The medium is not particularly limited as long as the liquid crystal polyester powder is insoluble, and is preferably a dispersion medium. The medium is preferably a fluid and more preferably a liquid.

The turn "dispersion" in the description is a term for distinguishing from a state in which the liquid crystal polyester powder is dissolved (excluding a state in which the liquid crystal polyester powder is dissolved in the liquid crystal polyester composition). There may be non-uniform portions in the distribution of the liquid crystal polyester powder in the composition. It is sufficient for the state of the liquid crystal polyester powder in the composition to be a state in which the liquid crystal polyester composition can be applied to the support in the above-described method for producing a liquid crystal polyester film.

Examples of the medium include halogenated hydrocarbons such as dichloromethane, chloroform, 1,1-dichloroethane, 1,2-dichloroethane, 1,1,2,2-tetrachloroethane, 1-chlorobutane, chlorobenzene, and o-dichlorobenzene; halogenated phenols such as p-chlorophenol, pentachlorophenol, and pentafluorophenol; ethers such as diethyl ether, tetrahydrofuran, and 1,4-dioxane; ketones such as acetone and cyclohexanone; esters such as ethyl acetate and γ-butyrolactone; carbonates such as ethylene carbonate and propylene carbonate; amines such as triethylamine; nitrogen-containing heterocyclic aromatic compounds such as pyridine; nitriles such as acetonitrile and succinonitrile; amides such as N,N-dimethylformamide, N,N-dimethylacetamide, and N-methylpyrrolidone; urea compounds such as tetramethylurea; nitro compounds such as nitromethane and nitrobenzene; sulfur compounds such as dimethylsulfoxide and sulfolane; and phosphorus compounds such as hexamethylphosphate amide and tri-n-butyl phosphate. In addition, two or more thereof may be used.

As the medium, because of its low corrosiveness and ease of handling, a medium containing, as a main component, an aprotic compound, particularly an aprotic compound having no halogen atom, is preferable, and the proportion of the aprotic compound in the entire medium is preferably 50% to 100% by mass, more preferably 70% to 100% by mass, and still more preferably 90% to 100% by mass. Further, as the above-described aprotic compound, amides such as N—N-dimethylformamide, N,N-dimethylacetamide, tetramethylurea, and N-methylpyrrolidone or esters such as γ-butyrolactone are preferable, and N,N-dimethylformamide, N,N-dimethylacetamide, or N-methylpyrrolidone is more preferable.

Further, as the medium, for the reason that it is easy to remove, a medium containing, as a main component, a compound in which the boiling point at 1 atm is 220° C. or lower is preferable, and the proportion of the compound in which the boiling point at 1 atm is 220° C. or lower in the entire medium is preferably 50% to 100% by mass, more preferably 70% to 100% by mass, and still more preferably 90% to 100% by mass. As the above-described aprotic compound, it is preferable to use the compound in which the boiling point at 1 atm is 220° C. or lower.

As an example, the proportion of the liquid crystal polyester powder may be 50% to 100% by mass, 70% to 100% by mass, or 90% to 100% by mass relative to the total amount of the solid content contained in the liquid crystal polyester composition.

The proportion of the liquid crystal polyester powder contained in the liquid crystal polyester composition is preferably 0.1% to 60% by mass, more preferably 1% to 50% by mass, still more preferably 3% to 40% by mass, and particularly preferably 5% to 30% by mass relative to the total amount of the liquid crystal polyester powder and the medium.

The liquid crystal polyester composition can be obtained by mixing the liquid crystal polyester powder, the medium, and other components used as necessary, all at once or in an appropriate order.

The liquid crystal polyester composition may contain one or more other components such as a filler, an additive, and a resin other than the liquid crystal polyester.

Examples of the filler include inorganic fillers such as silica, alumina, titanium oxide, barium titanate, strontium titanate, aluminum hydroxide, and calcium carbonate; and organic fillers such as a cured epoxy resin, a crosslinked benzoguanamine resin, and a crosslinked acrylic resin, and the content thereof relative to 100 parts by mass of the liquid crystal polyester may be 0, preferably 100 parts by mass or less.

Examples of the additive include leveling agents, antifoaming agents, antioxidants, UV absorbers, flame retardants, and colorants, and the content thereof relative to 100 parts by mass of the liquid crystal polyester may be 0, preferably 5 parts by mass or less.

Examples of the resin other than the liquid crystal polyester include thermoplastic resins other than the liquid crystal polyester, such as polypropylene, polyamide, polyesters other than the liquid crystal polyester, polyphenylene sulfide, polyetherketone, polycarbonate, polyethersulfone, polyphenylene ether and its modified products, and polyetherimide; elastomers such as a copolymer of glycidyl methacrylate and polyethylene; and thermosetting resins such as a phenol resin, an epoxy resin, a polyimide resin, and a cyanate resin, and the content thereof relative to 100 parts by mass of the liquid crystal polyester may be 0, preferably 20 parts by mass or less.

<Resin Powder>

The resin powder of the embodiment contains a thermoplastic resin having a number average molecular weight of 10000 or less, and has an average particle diameter of 0.5 to 20 μm.

The content ratio of the thermoplastic resin may be 50% to 100% by mass or 80% to 95% by mass relative to 100% by mass of the resin powder of the embodiment.

The thermoplastic resin is preferably a liquid crystal polyester.

The content ratio of the liquid crystal polyester may be 50% to 100% by mass or 80% to 95% by mass relative to 100% by mass of the resin powder of the embodiment.

Hereinafter, embodiments in which the liquid crystal polyester is used as the thermoplastic resin be described.

The resin powder of the embodiment contains a liquid crystal polyester having a number average molecular weight of 10000 or less, and has an average particle diameter of 0.5 to 20 μm (hereinafter referred to as a "liquid crystal polyester powder"). The liquid crystal polyester powder of the embodiment is suitable as a raw material for the method for producing the liquid crystal polyester film or the laminate. With the liquid crystal polyester powder satisfying the above-described regulations, it is possible to produce a liquid crystal polyester film having suitable quality as a film for electronic components. Examples of quality criteria include an isotropic property, thickness, and appearance (presence or absence of holes or through holes) of the film. Examples of the liquid crystal polyester film include those exemplified in «Film» described above.

In the present specification, the "number average molecular weight" is an absolute value measured using a gel permeation chromatograph-multi-angle light scattering photometer.

The number average molecular weight of the liquid crystal polyester in the liquid crystal polyester powder of the embodiment is 10000 or less, more preferably 3000 to 10000, still more preferably 4000 to 8000, and particularly preferably 5000 to 7000. In a case where the number average molecular weight of the liquid crystal polyester is more than 10000, the liquid crystal polyester composition becomes a gel, which makes it difficult to form a film having an excellent isotropic property. Further, as the number average molecular weight of the liquid crystal polyester is smaller, the thermal conductivity in the thickness direction of the film after the heat treatment tends to be more improved, which is preferable. In addition, in a case where the number average molecular weight of the liquid crystal polyester is the above-described lower limit value or greater, the heat resistance, strength, and rigidity of the film after the heat treatment are good.

The flow start temperature of the liquid crystal polyester in the liquid crystal polyester powder of the embodiment is preferably 250° C. or higher, more preferably 250° C. or higher and 350° C. or lower, and still more preferably 260° C. or higher and 330° C. or lower. As the flow start temperature of the liquid crystal polyester is higher, it is easier to improve the heat resistance, strength, and rigidity, but in a case where the flow start temperature of the liquid crystal polyester is too high, grindability deteriorates and it becomes difficult to obtain a powder having a target particle diameter.

The flow start temperature, which is also called the flow temperature, is a temperature at which a viscosity of 4800

Pa·s (48000 poises) is shown in a case where, using a capillary rheometer, the liquid crystal polyester is melted and extruded from a nozzle with an inner diameter of 1 mm and a length of 10 mm while increasing the temperature at a rate of 4° C./min under a load of 9.8 MPa (100 kg/cm$^2$), and is an indication of a molecular weight of the liquid crystal polyester (see "Liquid Crystal Polymer-Synthesis, Molding and Application-" edited by Naoyuki Koide, page 95, published by CMC CO., LTD., issued on Jun. 5, 1987)).

The average particle diameter of the liquid crystal polyester powder is 20 µm or less, preferably 18 µm or less, more preferably 15 µm or less, and still more preferably 10 µm or less. In a case where the average particle diameter of the liquid crystal polyester is more than 20 µm, it becomes difficult to obtain a liquid crystal polyester film having a good appearance. For example, as shown in examples that will be described later, in a case where the average particle diameter of the liquid crystal polyester is more than 20 µm, through holes may be formed in the produced liquid crystal polyester film. The formation of the through holes tends to occur at a thickness range of 50 µm or less, which is a suitable thickness range for a film for electronic components. That is, since the average particle diameter of the liquid crystal polyester is 20 µm or less, a film having both a thickness and an appearance suitable for electronic components can be easily produced.

Further, from the viewpoint of ease of handling the powder, the average particle diameter of the liquid crystal polyester powder is preferably 0.5 µm or greater, more preferably 3 µm or greater, and still more preferably 5 µm or greater.

The upper limit value and the lower limit value of the average particle diameter of the above-described liquid crystal polyester powder can be freely combined. As examples of the numerical range of the average particle diameter value of the above-described liquid crystal polyester powder, it may be 0.5 µm or greater and 20 µm or less, 3 µm or greater and 18 µm or less, 5 µm or greater and 15 µm, or 5 µm or greater and 10 µm or less.

In the present specification, the "average particle diameter" is the value of the particle diameter at the point where the cumulative volume reaches 50% (the 50% cumulative volume particle size $D_{50}$) in a volume-based cumulative particle size distribution curve, in which the total volume is deemed 100%, obtained by performing measurements according to a laser diffraction scattering method.

As a method of controlling the particle diameter within the above-described range, for example, in the case of using a jet mill, the particle diameter can be controlled by changing the rotation speed of the classification rotor, the grinding nozzle pressure, the processing speed, and the like.

In a case where the resin composition of the embodiment includes liquid crystal polyesters, the content of the above-described liquid crystal polyester of the embodiment may be more than 70% by mass and 100% by mass or less, or 80% to 100% by mass relative to the total 100% by mass of liquid crystal polyesters included in the resin composition. Examples of the liquid crystal polyester include those exemplified in the film of the embodiment and the resin powder of the embodiment, and among the liquid crystal polyesters described in the section of (Liquid crystal polyester) of the above-described embodiment, the liquid crystal polyester may be a liquid crystal polyester which does not correspond to the above-described component (X). For example, the liquid crystal polyester may be the liquid crystal polyester of 1) to 4) described above, the liquid crystal polyester having the structural unit represented by Formula (1) described above, the structural unit represented by Formula (2) described above, and the structural unit represented by Formula (3) described above, or the liquid crystal polyester having the structural unit represented by Formula (2) described above and the structural unit represented by Formula (3) described above.

The resin composition of the embodiment may contain the medium and the resin powder (however, in a case where the liquid crystal polyester powder is contained as the resin powder, the content of the liquid crystal polyester soluble in the aprotic solvent is less than 5% by mass relative to the total 100% by mass of the liquid crystal polyester).

The resin composition of the embodiment may contain the medium and the resin powder (however, those containing liquid crystal polyester soluble in the aprotic solvent are excluded).

Here, examples of the liquid crystal polyester soluble in the aprotic solvent include those exemplified in the film of the embodiment.

Further, in the above-described method for producing the liquid crystal polyester film or the laminate, since it is not necessary to dissolve the liquid crystal polyester powder in the solvent, a powder of the liquid crystal polyester having excellent dielectric properties can be used as a raw material. A liquid crystal polyester film having excellent dielectric properties can be produced from the liquid crystal polyester powder having excellent dielectric properties.

The liquid crystal polyester powder of the embodiment preferably has a relative permittivity at a frequency of 1 GHz of 3 or less, preferably 2.9 or less, preferably 2.8 or less, more preferably less than 2.8, still more preferably 2.78 or less, and particularly preferably 2.76 or less. Further, the relative permittivity of the liquid crystal polyester powder may be 2.5 or greater, 2.6 or greater, or 2.7 or greater.

The upper limit value and the lower limit value of the above-described relative permittivity value of the above-described liquid crystal polyester powder can be freely combined. As examples of the numerical range of the above-described relative permittivity value of the above-described liquid crystal polyester powder, it may be 2.5 or greater and 3 or less, 2.6 or greater and 2.78 or less, or 2.7 or greater and 2.76 or less.

The liquid crystal polyester powder of the embodiment preferably has a dielectric loss tangent at a frequency of 1 GHz of 0.005 or less, preferably 0.004 or less, more preferably 0.003 or less, still more preferably 0.0025 or less, and particularly preferably 0.002 or less. Further, the dielectric loss tangent of the liquid crystal polyester powder may be 0.0003 or greater, 0.0005 or greater, or 0.001 or greater.

The upper limit value and the lower limit value of the above-described dielectric loss tangent value of the above-described liquid crystal polyester powder can be freely combined. As examples of the numerical range of the above-described dielectric loss tangent value of the above-described liquid crystal polyester powder, it may be 0.0003 or greater and 0.005 or less, 0.0005 or greater and 0.004 or less, 0.001 or greater and 0.003 or less, 0.001 or greater and 0.0025 or less, or 0.001 or greater and 0.002 or less.

The relative permittivity and dielectric loss tangent of the liquid crystal polyester powder at a frequency of 1 GHz can be measured under the following conditions by a capacity method using an impedance analyzer.

After melting a liquid crystal polyester fine particle powder at a temperature 5° C. higher than the melting point measured using a flow tester, the liquid crystal polyester fine particle powder is cooled and solidified to produce tablets having a diameter of 1 cm and a thickness of 0.5 cm. The relative permittivity and dielectric loss tangent at 1 GHz are measured for the obtained tablets under the following conditions.

Measurement method: capacity method
Electrode model: 16453A
Measurement environment: 23° C., 50% RH
Applied voltage: 1 V The relative permittivity and dielectric loss tangent of the liquid crystal polyester powder of the embodiment may be different from those of the liquid crystal polyester film produced from the powder as a raw material. This is considered to be due to the difference in molecular weight of the contained liquid crystal polyester.

The liquid crystal polyester powder is preferably insoluble in the medium contained in the above-described liquid crystal polyester composition, and more preferably insoluble in a protonic solvent.

Here, whether or not it is insoluble in the medium can be ascertained by performing the following test. In the following test method, a case where the medium is an aprotic solvent will be described.

Test Method

The liquid crystal polyester powder (5 parts by weight) is stirred in an aprotic solve (medium) (95 parts by weight) at a temperature of 180° C. using an anchor blade under stirring conditions of 200 rpm for 6 hours, and is cooled to room temperature. Subsequently, the solution is filtered using a membrane filter having a mesh size of 5 μm and a pressurized filtration device, and the presence of any residue on the membrane filter is ascertained. In a case where no solid matter is noticeable at this time, the liquid crystalline polyester is deemed to be soluble in the aprotic solvent (medium). In a case where a solid matter having a minor axis of 5 μm or greater is noticeable at this time, the liquid crystalline polyester is deemed to be insoluble in the aprotic solvent (medium). The solid matter having a minor axis of 5 μm or greater can be ascertained by microscopic observation.

The content ratio of the liquid crystal polyester may be 50% to 100% by mass or 80% to 95% by mass relative to 100% by mass of the liquid crystal polyester powder of the embodiment.

Examples of the details of the liquid crystal polyester include those described in «Film», and the description thereof will be omitted.

For example, the liquid crystal polyester powder of the embodiment can be obtained by subjecting a powder of a liquid crystal polyester having a number average molecular weight of 10000 or less, which is produced by the above-described liquid crystal polyester producing method, to a grinding treatment with a jet mill as necessary, so that the average particle diameter is 0.5 to 20 μm.

The liquid crystal polyester powder of the embodiment may be a liquid crystal polyester powder containing a liquid crystal polyester having a number average molecular weight of 10000 or less and having an average particle diameter of 0.5 to 20 μm (however, excluding those obtained from a liquid crystal polyester composed of a structural unit derived from 2-hydroxy-6-naphthoic acid, a structural unit derived from 2,6-naphthalenedicarboxylic acid, a structural unit derived from terephthalic acid, and a structural unit derived from hydroquinone, and having a volume average particle diameter of 9 μm).

The liquid crystal polyester powder of the embodiment may be a liquid crystal polyester powder containing a liquid crystal polyester having a number average molecular weight of 10000 or less and having an average particle diameter of 0.5 to 20 μm (however, excluding a liquid crystal polyester powder obtained from a liquid crystal polyester which is a polymer obtained by reacting a mixture of 2-hydroxy-6-naphthoic acid (5.5 mol), 2,6-naphthalenedicarboxylic acid (1.75 mol), terephthalic acid (0.5 mol), hydroquinone (2.475 mol), acetic anhydride (12 mol), and 1-methylimidazole as a catalyst, and having a volume average particle diameter of 9 μm).

The liquid crystal polyester powder of the embodiment may be a liquid crystal polyester powder containing a liquid crystal polyester having a number average molecular weight of 10000 or less and having an average particle diameter of 0.5 to 20 μm (however, excluding a liquid crystal polyester powder obtained by grinding a liquid crystal polyester composed of a structural unit derived from 2-hydroxy-6-naphthoic acid, a structural unit derived from 2,6-naphthalenedicarboxylic acid, a structural unit derived from terephthalic acid, and a structural unit derived from hydroquinone, which has a flow start temperature of 265° C., and having a volume average particle diameter of 9 μm).

The liquid crystal polyester powder of the embodiment may be a liquid crystal polyester powder containing a liquid crystal polyester having a number average molecular weight of 10000 or less and having an average particle diameter of 0.5 to 20 μm (however, excluding a liquid crystal polyester powder including a structural unit derived from 2-hydroxy-6-naphthoic acid, a structural unit derived from 2,6-naphthalenedicarboxylic acid, a structural unit derived from terephthalic acid, and a structural unit derived from hydroquinone, and having a volume average particle diameter of 9 μm).

The liquid crystal polyester powder of the embodiment may be a liquid crystal polyester powder containing a liquid crystal polyester having a number average molecular weight of 10000 or less and having an average particle diameter of 0.5 to 20 μm (however, excluding a liquid crystal polyester powder which is a polymer obtained by reacting a mixture of 2-hydroxy-6-naphthoic acid (0.5 mol), 2,6-naphthalenedicarboxylic acid (1.75 mol), terephthalic acid (0.5 mol), hydroquinone (2.475 mol), acetic anhydride (12 mol), and 1-methylimidazole as a catalyst, and has a volume average particle diameter of 9 μm).

The liquid crystal polyester powder of the embodiment may be a liquid crystal polyester powder containing a liquid crystal polyester having a number average molecular weight of 10000 or less and having an average particle diameter of 0.5 to 20 μm (however, excluding a liquid crystal polyester powder obtained by grinding a liquid crystal polyester including a structural unit derived from 2-hydroxy-6-naphthoic acid, a structural unit derived from 2,6-naphthalenedicarboxylic acid, a structural unit derived from terephthalic acid, and a structural unit derived from hydroquinone, which has a flow start temperature of 265° C., and having a volume average particle diameter of 9 μm).

The liquid crystal polyester powder of the embodiment may be a liquid crystal polyester powder containing a liquid crystal polyester having a number average molecular weight of 10000 or less and having an average particle diameter of 0.5 to 20 μm (however, excluding a liquid crystal polyester powder obtained by grinding a polymer obtained by reacting a mixture of 2-hydroxy-6-naphthoic acid (5.5 mol), 2,6-naphthalenedicarboxylic acid (1.75 mol), terephthalic acid (0.5 mol), hydroquinone (2.475 mol), acetic anhydride (12 mol), and 1-methylimidazole as a catalyst, in which the polymer has a flow start temperature of 265° C., and having a volume average particle diameter of 9 μm).

The "volume average particle diameter" here is a value measured with regard to a dispersion liquid of the liquid crystalline polyester powder, obtained by dispersing 0.01 g of the liquid crystalline polyester powder in approximately 10 g of pure water by ultrasonic waves for 5 minutes, using a scattering particle diameter distribution measurement device (for example, "LA-950V2" from HORIBA, Ltd.), assuming that the refractive index of the pure water is 1.333. The "volume average particle diameter" is the value of the particle diameter at the point where the cumulative volume reaches 50% (the 50% cumulative volume particle size $D_{50}$) in a volume-based cumulative particle size distribution curve, in which the total volume is deemed 100%, obtained by performing measurements using a scattering particle diameter distribution measurement device.

Further, acetic acid derived from acetic anhydride, which is a raw material of the liquid crystal polyester, may remain in the liquid crystal polyester powder, but from the viewpoint of mechanical properties after processing into a film, the upper limit value of the amount of residual acetic acid which can be contained in 100% by mass of the liquid crystal polyester powder of the embodiment is preferably 1% by mass or less, more preferably 500 ppm by mass or less, and still more preferably 300 ppm by mass or less. Further, from the viewpoint of grindability, the lower limit value of the amount of residual acetic acid which is contained in 100% by mass of the liquid crystal polyester powder of the embodiment is preferably 30 ppm by mass or greater, more preferably 50 ppm by mass or greater, and still more preferably 100 ppm by mass or greater.

The upper limit value and the lower limit value of the amount of residual acetic acid which can be contained in 100% by mass of the above-described liquid crystal polyester powder can be freely combined. As an example of the numerical range of the amount of residual acetic acid which can be contained in 100% by mass of the above-described liquid crystal polyester powder, it may be 30 ppm by mass or greater and 1% by mass or less, 50 ppm by mass or greater and 500 ppm by mass or less, or 100 ppm by mass or greater and 300 ppm by mass or less.

With the liquid crystal polyester powder of the embodiment, it is possible to produce a liquid crystal polyester film having suitable quality as a film for electronic components. Examples of quality criteria include an isotropic property, thickness, and appearance (presence or absence of holes or through holes) of the film.

Since the number average molecular weight of the liquid crystal polyester in the liquid crystal polyester powder of the embodiment is a relatively small value of 10000 or less, the liquid crystal polyester composition has properties suitable for coating, and the melting state of the liquid crystal polyester film during heat treatment becomes good, and thus it is possible to form a liquid crystal polyester film having an excellent isotropic property. Furthermore, since the average particle diameter of the liquid crystal polyester powder of the embodiment is 0.5 to 20 μm, a high-quality polyester film which has a thinness suitable for a film application for electronic components and in which the generation of holes or through holes is suppressed is obtained.

With the liquid crystal polyester powder of the embodiment, a liquid crystal polyester film having an excellent isotropic property can be produced.

Conventionally, a liquid crystal polyester film is generally produced according to a melt molding method or a casting method, in which a liquid crystal polyester is melted.

The melt molding method is a method of molding a film by extruding a kneaded product from an extruder. However, in the film produced by the melt molding method, liquid crystal polyester molecules are oriented in a film forming direction (also referred to as an extrusion direction; Machine Direction (MD)) rather than in a lateral direction with respect to the extrusion direction (direction perpendicular to the extrusion direction and film thickness direction; Transverse Direction (TD)), and it is difficult to obtain a liquid crystal polyester having an excellent isotropic property.

On the other hand, with the liquid crystal polyester powder of the embodiment, a liquid crystal polyester film having an excellent isotropic property can be produced. The liquid crystal polyester powder of the embodiment is suitable as a raw material for the method for producing the film according to the embodiment, and by applying the method, a liquid crystal polyester film having an excellent isotropic property can be easily produced without requiring the molding operation by extrusion.

Here, "excellent isotropic property" of the liquid crystal polyester film means that the value of the molecular orientation (MOR) of the liquid crystal polyester film is in a range of 1 to 1.1.

With the liquid crystal polyester powder of the embodiment, a liquid crystal polyester film having both dielectric properties and an isotropic property can be produced.

The liquid crystal polyester film produced by the solution casting method has an isotropic orientation of the liquid crystal polyester as compared with the liquid crystal polyester film formed by the melt molding method. However, in order to apply the solution casting method, there is a limitation that a liquid crystal polyester having a solvent-soluble property is used. Liquid crystal polyesters having increased solubility in a solvent may have reduced dielectric properties due to, for example, increased polarity.

As described above, it has been difficult to achieve both the dielectric properties and the isotropic property of the liquid crystal polyester film at a high level.

On the other hand, with the liquid crystal polyester powder of the embodiment, a liquid crystal polyester film having both dielectric properties and an isotropic property can be produced. The liquid crystal polyester powder of the embodiment is suitable as a raw material for the method for producing the film according to the embodiment, and by applying the method, a liquid crystal polyester film having an excellent isotropic property can be easily produced without requiring the operation of dissolving the liquid crystal polyester powder in a solvent. Further, since a liquid crystal polyester having excellent dielectric properties can be used as a raw material, a liquid crystal polyester film having dielectric properties and an isotropic property that are excellent can be easily produced.

EXAMPLES

Next, the present invention will be described in more detail with reference to the following examples, but the present invention is not limited to the following examples.

<Measurement Method>

[Measurement of Flow Start Temperature of Liquid Crystal Polyester]

Using a flow tester (model: CFT-500 manufactured by Shimadzu Corporation), approximately 2 g of the liquid crystal polyester was packed in a cylinder equipped with a die having a nozzle with an inner diameter of 1 mm and a length of 10 mm, the liquid crystal polyester was melted and extruded from the nozzle while the temperature was increased at a rate of 4° C./minute under a load of 9.8 MPa (100 kg/cm$^2$), and the temperature (FT) that yielded a viscosity of 4,800 Pa·s (48,000 P) was measured.

[Measurement of Melting Point of Liquid Crystal Polyester]

Using a differential scanning calorimeter ("DSC-50" from Shimadzu Corporation), the temperature was increased at a heating rate of 10° C./min, the position of the endothermic peak was confirmed, and the temperature at the apex position of the endothermic peak was measured as a melting point of the liquid crystal polyester.

[Measurement of Molecular Weight of Liquid Crystal Polyester Contained Liquid Crystal Polyester Fine Particle Powder]

Using a gel permeation chromatograph-multi-angle light scattering photometer (differential refractometer (RID-20A manufactured by Shimadzu Corporation), multiangle light scattering detector (EOS manufactured by Wyatt Technology Corporation), column (Shodex K-G, K-806M (2 pieces), K-802 (1 piece) (φ: 8.0 mm×30 cm) manufactured by SHOWA DENKO K.K., solvent (pentafluorophenol/chloroform (weight ratio: 35/65)))), the number average molecular weight of the liquid crystal polyester contained in the liquid crystal polyester fine particle powder was measured. The sample solution for measurement was prepared by adding 2 mg of a sample to 1.4 g of pentafluorophenol, dissolving the sample at 80° C. for 2 hours, cooling the solution to room temperature, adding 2.6 g of chloroform to the solution, diluting the solution twice with a solvent (pentafluorophenol/chloroform (weight ratio: 35/65)), and filtering the solution using a filter having a pore size of 0.45 μm.

[Analysis of Amount of Residual Acetic Acid Contained in Liquid Crystal Polyester Fine Particle Powder]

Using a headspace gas chromatograph device (GC-2014 manufactured by Shimadzu Corporation), the amount of residual acetic acid in the liquid crystal polyester fine particle powder was analyzed under extraction conditions of 120° C. and 20 h and analytical conditions of 200° C. and 1 h.

[Measurement of Relative Permittivity and Dielectric Loss Tangent of Liquid Crystal Polyester Fine Particle Powder]

After melting a liquid crystal polyester fine particle powder at a temperature 5° C. higher than the melting point measured using a flow tester ("CFT-500 type" from Shimadzu Corporation), the liquid crystal polyester fine particle powder is cooled and solidified to produce tablets having a diameter of 1 cm and a thickness of 0.5 cm. The relative permittivity and dielectric loss tangent at 1 GHz were measured for the obtained tablets under the following conditions.

Measurement method: capacity method (device: impedance analyzer (E4991A manufactured by Agilent))
Electrode model: 16453A
Measurement environment: 23° C., 50% RH
Applied voltage: 1 V

[Measurement of Average Particle Diameter of Liquid Crystal Polyester Fine Particle Powder]

0.01 g of the liquid crystal polyester fine particle powder was weighed and dispersed in approximately 10 g of pure water. The prepared dispersion liquid of the liquid crystal polyester fine particle powder was dispersed by ultrasonic waves for 5 minutes. Using a scattering particle diameter distribution measurement device ("LA-950V2" from HORIBA, Ltd.), the volume-based cumulative particle size distribution of the liquid crystal polyester particle powder was measured assuming that the refractive index of the pure water was 1.333, and the average particle diameter ($D_{50}$) was calculated.

[Measurement of Relative Permittivity and Dielectric Loss Tangent of Liquid Crystal Polyester Film]

After melting a liquid crystal polyester film at 350° C. using a flow tester ("CFT-500 type" from Shimadzu Corporation), the liquid crystal polyester film is cooled and solidified to produce tablets having a diameter of 1 cm and a thickness of 0.5 cm. The relative permittivity and dielectric loss tangent at 1 GHz were measured for the obtained tablets under the following conditions.

Measurement method: capacity method (device: impedance analyzer (E4991A manufactured by Agilent))
Electrode model: 16453A
Measurement environment: 23° C., 50% RH
Applied voltage: 1 V

[Measurement of Molecular Orientation of Liquid Crystal Polyester Film]

The film was cut into a 5 cm square, and placed in a holder, and using a molecular orientation meter (manufactured by Oji Scientific Instruments, model: MOA-5012A), the molecular orientation was measured under conditions of a frequency of 12 GHz and a rotation speed of 1 rpm.

[Measurement of Linear Expansion Coefficient of Liquid Crystal Polyester Film]

Using a thermomechanical analyzer (manufactured by Rigaku Corporation, model: TMA8310), the linear expansion coefficient was measured from 50° C. to 100° C. at a heating rate of 5° C./min. The measurement was performed in the flow direction (MD) of the liquid crystal polyester film and the direction (TD) perpendicular to the flow direction. In each of the liquid crystal polyester films of examples, reference examples, and comparative examples formed by the casting method, the flow direction (MD) was defined as the applying direction of the dispersion liquid.

Production of Liquid Crystal Polyester Fine Particle Powder

Example 1

Production of Liquid Crystal Polyester (A)

A reactor equipped with a stirrer, a torque meter, a nitrogen gas inlet tube, a thermometer, and a reflux condenser was charged with 1,034.99 g (5.5 mol) of 2-hydroxy-6-naphthoic acid, 378.33 g (1.75 mol) of 2,6-naphthalenedicarboxylic acid, 83.07 g (0.5 mol) of terephthalic acid, 272.52 g (2.475 mol, a 0.225 mol excess relative to the total molar amount of 2,6-naphthalenedicarboxylic acid and terephthalic acid) of hydroquinone, 1,226.87 g (12 mol) of acetic anhydride, and 0.17 g of 1-methylimidazole as a catalyst. After flushing the gas inside the reactor with nitrogen gas, the temperature was increased from room temperature to 145° C. over 15 minutes under a stream of nitrogen gas with constant stirring, and the mixture was refluxed at 145° C. for 1 hour.

Subsequently, the temperature was increased from 145° C. to 310° C. over 3 hours and 30 minutes, and then held at 310° C. for 3 hours, while the by-product acetic acid and unreacted acetic anhydride were removed by distillation, the resultant solid liquid crystal polyester was extracted, and this liquid crystal polyester was cooled to room temperature to obtain a liquid crystal polyester (A).

The flow start temperature of the liquid crystal polyester (A) was 268° C. The liquid crystal polyester (A) was ground with a cutter mill VM-16 manufactured by Orient Pulverizing Machine Co., Ltd. to obtain a powder of the liquid crystal polyester (A) having an average particle diameter of 394 µm.

Production of Liquid Crystal Polyester Fine Particle Powder

Next, using a jet mill ("KJ-200" manufactured by KURIMOTO, LTD.; grinding nozzle diameter: 4.5 mm), the powder of the liquid crystal polyester (A) was ground by setting the classification rotor rotation speed to 10000 rpm, the grinding nozzle pressure to 0.64 MPa, and the processing speed to 2.1 kg/hour to obtain a liquid crystal polyester fine particle powder of Example 1. The average particle diameter of this liquid crystal polyester fine particle powder was 8 µm. Further, as a result of measuring the melting point of the liquid crystal polyester fine particle powder of Example 1 using a differential scanning calorimeter, the melting point was 290° C.

Reference Example 1

A liquid crystal polyester fine particle powder of Reference Example 1 was obtained in the same manner as in the production of the liquid crystal polyester fine particle powder of Example 1, except that the liquid crystal polyester powder was ground by setting the processing conditions of the jet mill ("KJ-200" manufactured by KURIMOTO, LTD.) to a classification rotor rotation speed of 10000 rpm, a grinding nozzle pressure of 0.63 MPa, and a processing speed of 2.6 kg/hour. The average particle diameter of this liquid crystal polyester fine particle powder was 10 µm.

Reference Example 2

A liquid crystal polyester fine particle powder Reference Example 2 was obtained in the same manner as in the production of the liquid crystal polyester fine particle powder of Example 1, except that the liquid crystal polyester powder was ground by setting the processing conditions of the jet mill ("KJ-200" manufactured by KURIMOTO, LTD.) to a classification rotor rotation speed of 10000 rpm, a grinding nozzle pressure of 0.60 MPa, and a processing speed of 4.0 kg/hour. The average particle diameter of this liquid crystal polyester fine particle powder was 15 µm.

Reference Example 3

A liquid crystal polyester fine particle powder Reference Example 3 was obtained in the same manner as in the production of the liquid crystal polyester fine particle powder of Example 1, except that the liquid crystal polyester powder was ground using, instead of the jet mill, a freezing/impact grinder (LINREX MILL LX manufactured by HOSOKAWA MICRON CORPORATION) at a processing speed of 10 kg/hour. The average particle diameter of this liquid crystal polyester fine particle powder was 27 µm.

Comparative Example 1

Production of Liquid Crystal Polyester (D)

The powder of the liquid crystal polyester (A) obtained in Example 1 was filled in an SUS tray and heat-treated at 290° C. for 6 hours to obtain a liquid crystal polyester (D).

Production of Liquid Crystal Polyester Fine Particle Powder

Next, a liquid crystal polyester fine particle powder of Comparative Example 1 was obtained in the same manner as in the production of the liquid crystal polyester fine particle powder of Example 1, except that, using the jet mill ("KJ-200" manufactured by KURIMOTO, LTD.), the powder of the liquid crystal polyester (D) was ground by setting the classification rotor rotation speed to 10000 rpm, the grinding nozzle pressure to 0.60 MPa, and the processing speed to 0.1 kg/hour. The average particle diameter of this liquid crystal polyester fine particle powder was 7 µm.

With regard to each of the obtained liquid crystal polyester fine particle powders, relative permittivity and dielectric loss tangent were measured.

Table 1 shows each of the above-described items and measurement results thereof.

Production of Liquid Crystal Polyester Film

Example 1-1, Reference Examples 1-1 to 3-1, and Comparative Example 1-1

Preparation of Dispersion Liquid 8 parts by weight of each of the above-described Example 1, Reference Examples 1 to 3, and Comparative Example 1 liquid crystal polyester fine particle powder was added to 92 parts by weight of N-methyl-2-pyrrolidone (boiling point (1 atm): 204° C.), and the mixture was stirred using a stirring defoamer AR-500 manufactured by THINKY CORPORATION to obtain each dispersion liquid.

Production of Liquid Crystal Polyester Film

Using a film applicator fitted with a micrometer ("SA204" manufactured by TQC Sheen B.V.) and an automatic coating apparatus ("model I" manufactured by Tester Sangyo Co., Ltd.), each of the above-described dispersion liquids was flow-casted onto a roughened surface of a copper foil (3EC-VLP manufactured by Mitsui Mining & Smelting Co., Ltd., 18 µm) in an amount such that the thickness of the flow cast film was 300 µm. Subsequently, drying was performed at 40° C. and normal pressure (1 atm) for 4 hours to remove the solvent from the flow cast film. Regarding Comparative Example 1-1, the dispersion liquid became a gel and could not be flow-casted, and therefore the film was not formed.

After the above-described drying, the temperature was further increased from room temperature to 310° C. at 7° C./min in a hot air oven under a nitrogen atmosphere, and heat treatment was performed to maintain the temperature at that temperature for 6 hours to obtain a liquid crystal polyester film with a copper foil.

The obtained liquid crystal polyester film with a copper foil was immersed in an aqueous solution of ferric chloride, and the copper foil was removed by etching to obtain a single-layer film.

The appearance of each film was ascertained. The liquid crystal polyester film of Reference Example 3-1 had a large number of holes on the surface and had a poor appearance, which was a quality unsuitable as a film for electronic components.

Table 1 shows each of the above-described items and measurement results thereof.

TABLE 1

|  |  |  | Example 1 | Reference Example 1 | Reference Example 2 | Reference Example 3 | Comparative Example 1 |
|---|---|---|---|---|---|---|---|
| Resin | Physical properties | FT [° C.] | 268 | 268 | 268 | 268 | 301 |
|  |  | Melting point [° C.] | 290 | 290 | 290 | 290 | 319 |
|  |  | Molecular weight Mn | 6030 | 6030 | 6030 | 6030 | 11650 |
| Fine particle powder | Producing conditions | Grinding method | Counter jet mill | Counter jet mill | Counter jet mill | Freezing/impact method | Counter jet mill |
|  |  | Grinding nozzle pressure | 0.64 | 0.63 | 0.60 | — | 0.64 |
|  |  | Processing speed [kg/h] | 2.1 | 2.9 | 5.0 | 10.0 | 0.1 |
|  | Physical properties | Average particle diameter [μm] | 8 | 10 | 15 | 27 | 7 |
|  |  | Amount of residual acetic acid [ppm by mass] | 194 | 129 | 207 | 95 | 9 |
|  |  | Relative permittivity | 2.74 | 2.74 | 2.74 | 2.74 | 2.80 |
|  |  | Dielectric loss tangent | 0.0020 | 0.0020 | 0.0020 | 0.0020 | 0.0015 |

|  |  |  | Example 1-1 | Reference Example 1-1 | Reference Example 2-1 | Reference Example 3-1 | Comparative Example 1-1* |
|---|---|---|---|---|---|---|---|
| Film | Producing conditions | Heating rate [° C./min] | 7.0 | 7.0 | 7.0 | 7.0 | — |
|  |  | Processing temperature [° C.] | 310.0 | 310.0 | 310.0 | 310.0 | — |
|  |  | Holding time [h] | 6.0 | 6.0 | 6.0 | 6.0 | — |
|  | Physical Properties | Thickness [μm] | 12 | 18 | 26 | 35 | — |
|  |  | Appearance | G | G | G | F | — |

*Film could not be formed.

In Comparative Example 1-1 where the liquid crystal polyester fine particle powder of Comparative Example 1 containing a liquid crystal polyester in which the number average molecular weight did not satisfy a range of 10000 or less was used as a raw material, the liquid crystal polyester film could not be produced. On the other hand, by using, as a raw material, the liquid crystal polyester fine particle powders of Example 1 and Reference Examples 1 to 3 containing a liquid crystal polyester in which the number average molecular weight satisfied the range of 10000 or less, the liquid crystal polyester films of Example 1-1 and Reference Examples 1-1 to 3-1 could be produced.

Further, the liquid crystal polyester film of Reference Example 3-1, which was produced using, as a raw material, the liquid crystal polyester fine particle powder of Reference Example 3 in which the average particle diameter did not satisfy a range of 0.5 to 20 μm, had many holes on the surface, and the appearance thereof was poor. On the other hand, the liquid crystal polyester films of Example 1-1 and Reference Examples 1-1 and 2-1, which were produced using, as a raw material, the liquid crystal polyester fine particle powders of Example 1 and Reference Examples 1 and 2, in which the average particle diameter satisfied the range of 0.5 to 20 μm, were thin and had an excellent appearance. As the results of the appearance evaluation of the liquid crystal polyester films of Examples 1-1 and Reference Examples 1-1 to 3-1, Table 1 shows "G" for those having no holes and having an excellent appearance, and "F" for those having a large number of holes and having a poor appearance.

<Production of Liquid Crystal Polyester Film>

Using the liquid crystal polyester fine particle powder of the liquid crystal polyester (A) obtained in Example 1 as a raw material, liquid crystal polyester films of Examples 1-1 to 1-5 were produced by changing the heat treatment conditions. The liquid crystal polyester film of Example 1-1 was obtained by the same production method as that of Example 1-1.

Example 1-1

Preparation of Dispersion Liquid 8 parts by weight of the liquid crystal polyester fine particle powder of the liquid crystal polyester (A) produced in Example 1 above was added to 92 parts by weight of N-methyl-2-pyrrolidone, and the mixture was stirred using a stirring defoamer AR-500 manufactured by THINKY CORPORATION to obtain a dispersion liquid.

Production of Liquid Crystal Polyester Film

Using a film applicator fitted with a micrometer ("SA204" manufactured by TQC Sheen B.V.) and an automatic coating apparatus ("model I" manufactured by Tester Sangyo Co., Ltd.), each of the above-described dispersion liquids was flow-casted onto a roughened surface of a copper foil (3EC-VLP manufactured by Mitsui Mining & Smelting Co., Ltd., 18 μm) in an amount such that the thickness of the flow cast film was 300 μm. Subsequently, drying was performed at 40° C. and normal pressure (1 atm) for 4 hours to remove the solvent from the flow cast film.

After the above-described drying, the temperature was further increased from room temperature to 310° C. at 7° C./min in a hot air oven under a nitrogen atmosphere, and heat treatment was performed to hold the temperature at that temperature for 6 hours to obtain a liquid crystal polyester film of Example 1-1 with a copper foil.

Example 1-2

A liquid crystal polyester film of Example 1-2 with a copper foil was obtained in the same manner as in the production of the liquid crystal polyester film of Example 1-1 with a copper foil, except that the temperature was raised from room temperature to 330° C. at 7° C./min instead of the above-described heat treatment conditions.

Example 1-3

A liquid crystal polyester film of Example 1-3 with a copper foil was obtained in the same manner as in the production of the liquid crystal polyester film of Example 1-1 with a copper foil, except that the temperature was raised from room temperature to 310° C. at 4° C./min instead of the above-described heat treatment conditions.

Example 1-4

A liquid crystal polyester time of Example 1-4 with a copper foil was obtained in the same manner as in the production of the liquid crystal polyester film of Example 1-1 with a copper foil, except that the temperature was raised from room temperature to 300° C. at 7° C./min instead of the above-described heat treatment conditions.

Example 1-5

A liquid crystal polyester film of Example 1-5 with a copper foil was obtained in the same manner as in the production of the liquid crystal polyester film of Example 1-1 with a copper foil, except that the temperature was raised from room temperature to 310° C. at 3° C./min instead of the above-described heat treatment conditions.

Comparative Example 2

A liquid crystal polyester soluble in an organic solvent was produced, and a liquid crystal polyester film of Comparative Example 2 was produced using the liquid crystal polyester as a raw material as follows.

Production of Liquid Crystal Polyester (B)

A reactor equipped with a stirrer, a torque meter, a nitrogen gas inlet tube, a thermometer, and a reflux condenser was charged with 940.9 g (5.0 mol) of 6-hydroxy-2-naphthoic acid, 377.9 g (2.5 mol) of 4'-hydroxyacetanilide, 415.3 g (2.5 mol) of isophthalic acid, and 867.8 g (8.4 mol) of acetic anhydride. After flushing the gas inside the reactor with nitrogen gas, the temperature was increased from room temperature to 140° C. over 60 minutes under a stream of nitrogen gas with constant stirring, and the mixture was refluxed at 140° C. for 3 hours.

Subsequently, while distilling off by-product acetic acid and unreacted acetic anhydride, the temperature was increased from 150° C. to 300° C. over 5 hours, and the mixture was held at 300° C. for 30 minutes, and then taken out from the reactor and cooled to room temperature. The obtained solid matter was ground with a grinder to obtain a powdered liquid crystal polyester (B1). The flow start temperature of the liquid crystal polyester (B1) was 193.3° C.

The liquid crystal polyester (B1) obtained above was subjected to a solid phase polymerization under a nitrogen atmosphere by increasing the temperature from room temperature to 160° C. over 2 hours and 20 minutes, subsequently raising the temperature from 160° C. to 180° C. over 3 hours and 20 minutes, and then holding the temperature at 180° C. for 5 hours, and the product was cooled and ground in a grinder to obtain a powdered liquid crystal polyester (B2). The flow start temperature of the liquid crystal polyester (B2) was 220° C.

The liquid crystal polyester (B2) obtained above was subjected to a solid phase polymerization under a nitrogen atmosphere by increasing the temperature from room temperature to 180° C. over 1 hour and 25 minutes, subsequently raising the temperature from 180° C. to 255° C. over 6 hours and 40 minutes, and then holding the temperature at 255° C. for 5 hours, and the product was cooled to obtain a powdered liquid crystal polyester (B). The flow start temperature of the liquid crystal polyester (B) was 302° C. Further, as a result of measuring the melting point of the liquid crystal polyester (B) using a differential scanning calorimeter, the melting point 311° C.

Preparation of Liquid Crystal Polyester Solution 8 parts by mass of the liquid crystal polyester (B) was added to 92 parts by mass of N-methylpyrrolidone (boiling point (1 atm): 204° C.), and the mixture was stirred at 140° C. for 4 hours under a nitrogen atmosphere to prepare a liquid crystal polyester solution. The viscosity of this liquid crystal polyester solution was 955 mPa·s.

Production of Liquid Crystal Polyester Film

Using a film applicator fitted with a micrometer ("SA204" manufactured by TQC Sheen B.V.) and an automatic coating apparatus ("model I" manufactured by Tester Sangyo Co., Ltd.), the liquid crystal polyester solution was flow-casted onto a roughened surface of a copper foil (3EC-VLP manufactured Mitsui Mining & Smelting Co., Ltd., 18 μm) in an amount such that the thickness of the flow cast film was 300 μm. Subsequently, drying was performed at 40° C. and normal pressure (1 atm) for 4 hours to remove the solvent from the flow cast film. Furthermore, a second flow-casting was performed on the surface of the dried liquid crystal polyester (B) so that the thickness of the flow cast film was 300 μm, and the dried liquid crystal polyester (B) was dried at 40° C. and normal pressure (1 atm) for 4 hours to remove the solvent from the flow cast film.

After the above-described drying, the temperature was further increased from room temperature to 270° C. at 1° C./min in a hot air oven under a nitrogen atmosphere, and heat treatment was performed to hold the temperature at that temperature for 2 hours to obtain a liquid crystal polyester film of Comparative Example 2 with a copper foil.

Comparative Example 3

Production of Liquid Crystal Polyester (C)

The powder of the liquid crystal polyester (A) obtained in Example 1 described above was filled in an SUS tray and heat-treated at 280° C. for 6 hours to obtain liquid crystal polyester (C). The flow start temperature of the obtained liquid crystal polyester (C) was 306° C.

Production of Liquid Crystal Polyester Film 100 parts by weight of the obtained liquid crystal polyester (C) was granulated at 325° C. using a twin-screw extruder ("PCM-30" manufactured by IKEGAI Corporation) to obtain pellets. Further, as a result of measuring the melting point of this pellet using a differential scanning calorimeter, the melting point was 319° C.

After melt-extruding the obtained pellets with a single-screw extruder, inflation film formation was performed using an annular inflation die having a die diameter of 30 mm and a slit spacing of 0.25 mm. At that time, using a filtration device (leaf disk type filter manufactured by Nippon Seisen Co., Ltd.) connected to the inlet of the annular inflation die, the film was formed while filtering the dissolved liquid crystal polyester. As the filtration device, 16 sheets of NASLON Filter LF4-0 NF2M-05D2 (manufactured by Nippon Seisen Co., Ltd., filtration accuracy: 5.0 μm, leaf disk type) were laminated and used.

From the annular inflation die heated to 340° C., a liquid crystal polyester film of Comparative Example 3 was obtained by extruding at a draw ratio of TD with respect to a draw ratio of MD under the condition of 4.3.

The liquid crystal polyester films with a copper foil obtained in Examples 1-1 to 1-5 and Comparative Examples 2 and 3 were immersed in an aqueous solution of ferric chloride, and the copper foil was removed by etching to obtain a single-layer film.

Table 2 shows each of the above-described items and measurement results thereof.

Since the liquid crystal polyester film of Comparative Example 3 was obtained by the inflation method, the liquid crystal polyester film of Comparative Example 3 tended to have high molecular orientation (MOR), and there was a difference in linear expansion between MD and TD.

The features described in the respective embodiments such as configurations and combinations of the configurations are only illustrative. Therefore, it is possible to add other configurations or to omit, replace or modify the configurations described herein without departing from the spirit of the invention. Further, the scope of the invention is not limited to the embodiments described hereinabove and is limited only by the Claims.

REFERENCE SIGNS LIST

1: liquid crystal polyester powder
3: medium
30: liquid crystal polyester composition
10: liquid crystal polyester film
11: film
12: support
13: metal layer
20, 21: laminate

TABLE 2

|  |  |  | Example | | | | | Comparative Example | |
|---|---|---|---|---|---|---|---|---|---|
|  |  |  | 1-1 | 1-2 | 1-3 | 1-4 | 1-5 | 2 | 3 |
| Film | Production method |  | Dispersion liquid cast | Dispersion liquid cast | Dispersion liquid cast | Dispersion liquid cast | Dispersion liquid cast | Solution cast | Inflation |
|  | Producing conditions | Heating rate [° C./min] | 7.0 | 7.0 | 4.0 | 7.0 | 3.0 | 1.0 | — |
|  |  | Processing temperature [° C] | 310 | 330 | 310 | 300 | 310 | 270 | — |
|  |  | Holding time [h] | 6.0 | 6.0 | 6.0 | 6.0 | 6.0 | 2.0 | — |
|  | Physical properties | Relative permittivity | 2.6 | 2.7 | 2.9 | 2.8 | 2.7 | 3.2 | 2.8 |
|  |  | Dielectric loss tangent | 0.0016 | 0.0015 | 0.0007 | 0.0017 | 0.001 | 0.003 | 0.0007 |
|  |  | Molecular orientation (MOR) | 1.01 | 1.00 | 1.03 | 1.03 | 1.02 | 1.00 | 1.71 |
|  |  | Linear expansion coefficient of MD and TD* [ppm/° C.] | 28  30 | 30  36 | 36  31 | 31  36 | 35  28 | 27  35 | 34  −1 | 2 |

*The left column is the value of the linear expansion coefficient of MD, and the right column is the value of the linear expansion coefficient of TD.

Since the liquid crystal polyester films of Examples to 1-5 were obtained by casting a dispersion liquid of liquid crystal polyester fine particle powder on a copper foil and then heat-treating the dispersion liquid (abbreviated as "Dispersion liquid cast" in the table), the liquid crystal polyester films of Examples 1-1 to 1-5 had excellent dielectric properties, low molecular orientation (MOR), and excellent properties.

Since the liquid crystal polyester film of Comparative Example 2 was obtained by casting a solution of liquid crystal polyester fine particle powder on a copper foil (abbreviated as "Solution cast" in the table), although the liquid crystal polyester film of Comparative Example 2 was non-oriented, it tended to be inferior in dielectric properties in the solution casting method because there was a limitation that the liquid crystal polyester soluble in a solvent was used as a raw material.

22: laminate precursor
40: liquid crystal polyester film precursor

What is claimed is:

1. A film comprising:
a thermoplastic resin, comprising a liquid crystal polyester,
wherein a relative permittivity of the film at a frequency of 1 GHz is 3 or less,
a dielectric loss tangent of the film at a frequency of 1 GHz is 0.005 or less, and
a molecular orientation (MOR) value of the film, which is measured by a microwave orientation meter, is in a range of 1 to 1.1, wherein the amount of the liquid crystal polyester soluble in an aprotic solvent is less than 5% by mass relative to the total 100% by mass of the liquid crystal polyester.

2. The film according to claim 1,
wherein
the liquid crystal polyester has a structural unit including a naphthalene structure.

3. The film according to claim 2,
wherein a content of the structural unit including a naphthalene structure is 40 mol % or greater, relative to 100 mol % of a total amount of structural units in the liquid crystal polyester.

4. The film according to claim 2,
wherein the liquid crystal polyester has a structural unit represented by Formula (1), a structural unit represented by Formula (2), and a structural unit represented by Formula (3), —O-Ar1-CO— (1)

—CO-Ar2-CO— (2)

—O-Ar3-O— (3)

(Ar1 represents a 2,6-naphthalenediyl group, a 1,4-phenylene group, or a 4,4'-biphenylylene group, Ar2 and Ar3 each independently represent a 2,6-naphthalenediyl group, a 2,7-naphthalenediyl group, a 1,4-phenylene group, a 1,3-phenylene group, or a 4,4'-biphenylylene group, and hydrogen atoms in the group represented by Ar1, Ar2, or Ar3 may each be independently substituted with a halogen atom, an alkyl group having 1 to 10 carbon atoms, or an aryl group having 6 to 20 carbon atoms).

5. The film according to claim 1,
wherein a linear expansion coefficient obtained in a temperature range of 50° C. to 100° C. under a condition of a heating rate of 5° C./min is 85 ppm/C or less.

6. A laminate comprising:
a metal layer; and
a film according to claim 1, which is laminated on the metal layer.

7. The laminate according to claim 6,
wherein a metal constituting the metal layer is copper.

* * * * *